(12) United States Patent
La Rosa

(10) Patent No.: US 9,460,798 B2
(45) Date of Patent: *Oct. 4, 2016

(54) PAGE OR WORD-ERASABLE COMPOSITE NON-VOLATILE MEMORY

(71) Applicant: STMicroelectronics (Rousset) SAS, Rousset (FR)

(72) Inventor: Francesco La Rosa, Rousset (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

This patent is subject to a terminal disclaimer.

(21) Appl. No.: 14/795,742

(22) Filed: Jul. 9, 2015

(65) Prior Publication Data

US 2016/0064089 A1   Mar. 3, 2016

(30) Foreign Application Priority Data

Sep. 3, 2014   (FR) .................................. 14 58239

(51) Int. Cl.
| | | |
|---|---|---|
| G11C 16/04 | (2006.01) | |
| G11C 16/14 | (2006.01) | |
| H01L 29/66 | (2006.01) | |
| H01L 29/788 | (2006.01) | |
| H01L 27/115 | (2006.01) | |
| G11C 16/08 | (2006.01) | |
| G11C 16/26 | (2006.01) | |

(52) U.S. Cl.
CPC .......... *G11C 16/14* (2013.01); *G11C 16/0408* (2013.01); *G11C 16/0433* (2013.01); *G11C 16/0441* (2013.01); *G11C 16/08* (2013.01); *H01L 27/11524* (2013.01); *H01L 29/66825* (2013.01); *H01L 29/7881* (2013.01); *G11C 16/26* (2013.01); *H01L 27/11556* (2013.01)

(58) Field of Classification Search
CPC .... G11C 16/10; G11C 16/0483; G11C 16/30
USPC ....................................... 365/185.12
See application file for complete search history.

(56) References Cited

U.S. PATENT DOCUMENTS

| | | |
|---|---|---|
| 5,182,725 A | 1/1993 | Andoh et al. |
| 6,433,382 B1 | 8/2002 | Orlowski et al. |
| 7,800,159 B2 | 9/2010 | Widjaja et al. |
| 2002/0153546 A1 | 10/2002 | Verhaar |
| 2004/0080982 A1 | 4/2004 | Roizin |
| 2004/0130947 A1 | 7/2004 | Fan et al. |
| 2005/0201158 A1 | 9/2005 | Rosa |
| 2005/0275002 A1 | 12/2005 | Shone |
| 2006/0234444 A1 | 10/2006 | Wu et al. |
| 2008/0070363 A1 | 3/2008 | Mokhlesi |
| 2008/0165582 A1 | 7/2008 | Georgescu et al. |
| 2009/0279360 A1 | 11/2009 | Lee et al. |
| 2010/0220533 A1 | 9/2010 | Chen et al. |
| 2010/0265765 A1 | 10/2010 | Seo et al. |

(Continued)

*Primary Examiner* — Huan Hoang
(74) *Attorney, Agent, or Firm* — Seed IP Law Group PLLC

(57) ABSTRACT

A non-volatile memory includes bit lines, a first page-erasable sector including memory cells of a first type, and a second word-erasable or bit-erasable sector including memory cells of a second type. The memory cells of the first type comprise a single floating-gate transistor and the memory cells of the second type comprise a first floating-gate transistor and a second floating-gate transistor the floating gates of which are electrically coupled, the second floating-gate transistor of a memory cell of the second type enabling the memory cell to be individually erased.

23 Claims, 12 Drawing Sheets

(56) References Cited

U.S. PATENT DOCUMENTS

| | | |
|---|---|---|
| 2012/0236646 A1 | 9/2012 | Hsu et al. |
| 2013/0228846 A1 | 9/2013 | La Rosa et al. |
| 2013/0229875 A1 | 9/2013 | La Rosa et al. |
| 2014/0036591 A1 | 2/2014 | Takeshita |
| 2014/0063957 A1 | 3/2014 | Pan et al. |
| 2014/0198583 A1 | 7/2014 | Kern et al. |
| 2015/0063038 A1 | 3/2015 | Lin et al. |
| 2015/0348640 A1* | 12/2015 | La Rosa ............... G11C 16/26 365/185.29 |
| 2015/0348981 A1* | 12/2015 | La Rosa ............ G11C 16/0433 365/185.29 |

* cited by examiner

PAGE OR WORD-ERASABLE COMPOSITE NON-VOLATILE MEMORY

BACKGROUND

1. Technical Field

The present disclosure relates to non-volatile memories and in particular to a memory array and memory cell structure of the type described in US application 2013/0228846, which is incorporated herein by reference in its entirety.

2. Description of the Related Art

As a reminder, FIG. 1 represents such a memory array structure MA0 and shows memory cells $M_{i,j}$, $M_{i-1,j}$, $M_{i,j+1}$, $M_{i-1,j+1}$ of the above-mentioned type, belonging here to two adjacent physical pages $P_i$, $P_{i-1}$ of the memory array, of respective ranks "i" and "i−1". The memory cells $M_{i,j}$, $M_{i-1,j}$, $M_{i,j+1}$, $M_{i-1,j+1}$ are read- and program-accessible through bit lines $BL_j$, $BL_{j+1}$, a word line $WL_{i-1,i}$ and control gate lines $CGL_i$, $CGL_{i-1}$. Each memory cell comprises a floating-gate transistor, respectively $T_{i,j}$, $T_{i-1,j}$, $T_{i,j+1}$, $T_{i-1,j+1}$. The drain terminals D of the transistors $T_{i,j}$, $T_{i-1,j}$ are connected to the bit line $BL_j$ and the drain terminals of the transistors $T_{i,j+1}$, $T_{i-1,j+1}$ are connected to the bit line $BL_{j+1}$. The control gates CG of the transistors $T_{i,j}$, $T_{i,j+1}$ are connected to the control gate line $CGL_i$ and the control gates CG of the floating-gate transistors $T_{i-1,j}$, $T_{i-1,j+1}$ are connected to the control gate line $CGL_{i-1}$.

Furthermore, each floating-gate transistor $T_{i,j}$, $T_{i-1,j}$, $T_{i,j+1}$, $T_{i-1,j+1}$ has its source terminal coupled to a source line SL through a respective select transistor ST. The select transistors ST of the memory cells $M_{i,j}$ and $M_{i-1,j}$ share the same control gate CSG and the two memory cells are, thus, referred to as "twins". Similarly, memory cells $M_{i,j+1}$ and $M_{i-1,j+1}$ are twin memory cells and their select transistors ST have a common control gate CSG. Each common control gate is preferentially a vertical gate embedded in a substrate receiving the memory array MA0, the source line SL also being an embedded line. These common control gates CSG, or twin memory cell select gates, are connected to the word line $WL_{i-1,j}$.

Such memory cells are channel-erased or programmed, i.e., by putting the substrate to a positive erase voltage or negative programming voltage causing electric charges to be extracted from their floating gates or electric charges to be injected into their floating gates, by Fowler Nordheim effect.

More particularly, a memory cell is erased by combining the positive voltage applied to the substrate with a negative voltage applied to the control gate of its floating-gate transistor, while the control gate of the floating-gate transistor of the twin memory cell receives a positive erase-inhibit voltage preventing it from being simultaneously erased (FIG. 11 of the above-mentioned application).

Similarly, a memory cell is programmed by combining a negative voltage applied to the bit line of the memory cell and to the substrate, with a positive voltage applied to the control gate of its floating-gate transistor, while the control gate of the floating-gate transistor of the twin memory cell receives a negative program-inhibit voltage preventing it from being simultaneously programmed (FIG. 12 of the above-mentioned application).

Finally, a memory cell is read by applying a positive voltage to the control gate of its floating-gate transistor, as well as a positive voltage to the corresponding bit line, while the twin memory cell, which is connected to the same bit line, receives on its control gate a negative read-inhibit voltage preventing it from being simultaneously read (FIG. 9 of the above-mentioned application).

This memory array structure having twin memory cells comprising a shared vertical select gate embedded in the substrate, offers the advantage of having a small footprint. The channel erase method that they use is well suited to the production of a page-erasable memory array but less so to the production of a word-erasable memory array. This emerges by comparing the word-erasable memory array represented in FIG. 24 of the above-mentioned application, with the page-erasable memory array represented in FIG. 23 of this application, the former being more complex than the latter. Therefore, for the memory array to be word-erasable, each control gate line CGL, instead of being connected to all the memory cells of a page, would be divided into a plurality of control gate lines with one control gate line per word. This causes a noticeable complexification of the word line and column decoders, and would involve providing various voltage switches to control, within each page, the control gate lines of the different words.

It can thus be desired to provide an improvement of this memory array and memory cell structure that is more appropriate for the implementation of a word-erasable memory, and does not cause any complexification of the control units of the memory array.

BRIEF SUMMARY

Some embodiments of the present disclosure relate to a non-volatile memory on a semiconductor substrate, comprising bit lines, memory cells of a first type each comprising only one floating-gate transistor, the floating-gate transistor comprising a drain region electrically coupled to a bit line, and memory cells of a second type each comprising a first floating-gate transistor comprising a drain region electrically coupled to a first bit line to which memory cells of the first type are also electrically coupled, and a second floating-gate transistor comprising a drain region electrically coupled to a second bit line to which memory cells of the first type are also electrically coupled, and in which: the floating gate of the first floating-gate transistor is electrically coupled to the floating gate of the second floating-gate transistor, and the second floating-gate transistor comprises a conductive region extending opposite its floating gate through a tunnel dielectric layer.

According to one embodiment, the memory comprises at least one first page-erasable or sector-erasable sector, comprising memory cells of the first type, and at least one word-erasable or bit-erasable second sector, comprising memory cells of the second type.

According to one embodiment, the conductive region of the second floating-gate transistor of a memory cell of the second type is a doped region of the substrate.

According to one embodiment, each floating-gate transistor of a memory cell of the first type and at least each first floating-gate transistor of a memory cell of the second type has a source region electrically coupled to a source line through a select transistor.

According to one embodiment, the select transistor comprises a vertical control gate embedded in the substrate.

According to one embodiment, the memory cells of the first type and of the second type are arranged by pairs, each memory cell pair comprising a common select transistor.

According to one embodiment, the memory is configured, when erasing a memory cell of the second type, to apply an erase voltage to the bit line to which the second floating-gate transistor of the memory cell is coupled, so as to extract electric charges from the floating gate of the second floating-gate transistor through the conductive region.

According to one embodiment, the memory is configured, when programming a memory cell of the first type, to apply a programming voltage to the bit line to which the floating-gate transistor of the memory cell is coupled, and when programming a memory cell of the second type, to apply a programming voltage to the bit line to which the second floating-gate transistor of the memory cell is coupled.

According to one embodiment, the memory is configured to read a memory cell of the first type through a bit line to which the floating-gate transistor of the memory cell is coupled, and read a memory cell of the second type through a bit line to which the first floating-gate transistor of the memory cell is coupled.

According to one embodiment, the memory comprises a column of bit lines, comprising several bit lines, a read circuit associated with the column to individually read a memory cell coupled to a bit line of the column, a programming circuit associated with the column to program a memory cell coupled to a bit line of the column, an erase circuit associated with the column to erase a memory cell of the second type coupled to a bit line of the column, a column decoder configured to couple bit lines of the column of the memory to the read circuit or to the programming circuit, and couple to the erase circuit bit lines of the column that are coupled to the second floating-gate transistors of the memory cells of the second type.

According to one embodiment, the column decoder is configured, when reading a memory cell of the first type, to couple any one of the bit lines to the read circuit, and when reading a memory cell of the second type, to couple to the read circuit a bit line coupled to the first floating-gate transistor of a memory cell.

According to one embodiment, the column decoder is configured, when programming a memory cell of the first type, to couple any one of the bit lines to the programming circuit, when programming a memory cell of the second type, to couple to the programming circuit a bit line coupled to the second floating-gate transistor of the memory cell, and when erasing a memory cell of the second type, to couple to the programming circuit a bit line coupled to the second floating-gate transistor of the memory cell.

According to one embodiment, the programming and erase circuits are grouped together in an erase or program block coupled to all the bit lines of a column through the column decoder, and supplying an erase voltage or a programming voltage.

According to one embodiment, the column decoder is configured to receive an address of a bit line within a column, a piece of information about the sector in which a memory cell is located, and a piece of information about a type of operation applied to a memory cell, i.e., read, program or erase.

According to one embodiment, the first sector comprises pages each comprising N binary words, and the second sector comprises pages each comprising N/2 words having the same number of bits as the words of the first sector.

BRIEF DESCRIPTION OF THE SEVERAL VIEWS OF THE DRAWINGS

Some embodiments and manufacturing methods of a memory array and memory cell structure according to the present disclosure, and methods for reading and writing memory cells according to the present disclosure, will be described below in relation with, but not limited to, the accompanying figures, in which.

DETAILED DESCRIPTION

Figure 1:
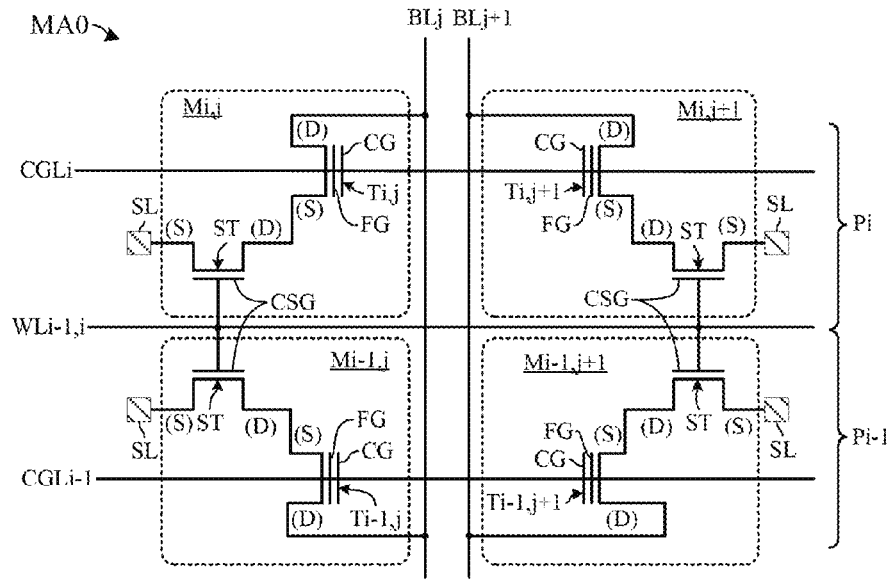
FIG. 1 described above is the wiring diagram of a conventional memory array and memory cell structure.
Figure 2:
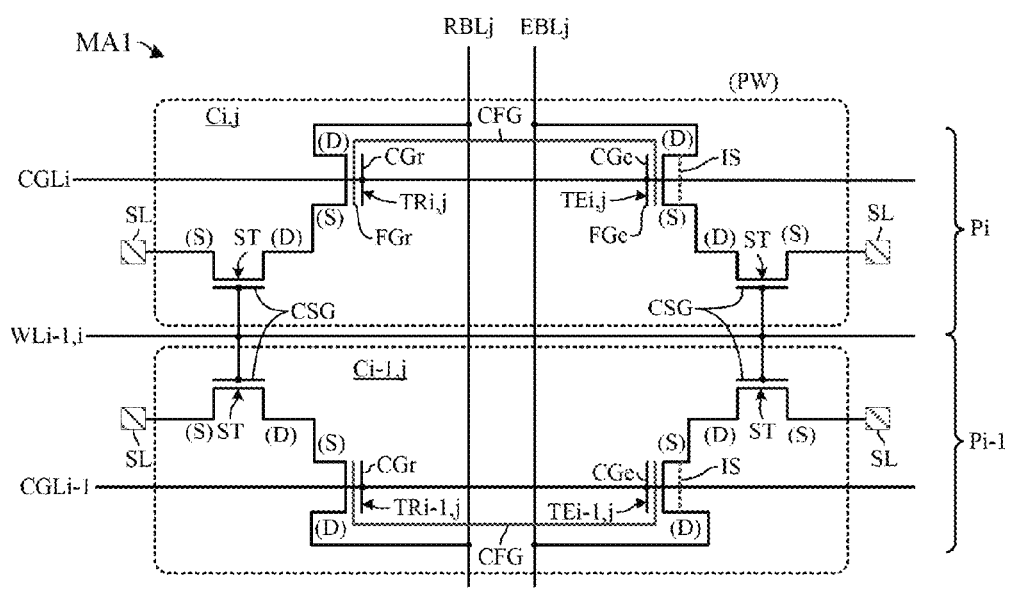
FIG. 2 is the wiring diagram of a first embodiment of a memory array and memory cell structure according to the present disclosure.

FIG. 2 is the wiring diagram of one embodiment of two memory cells $C_{i,j}$, $C_{i-1,j}$ and of a memory array MA1 according to the present disclosure, derived from the memory array and memory cell structure in FIG. 1.

The memory cells are read-, program- and erase-accessible via a first bit line $RBL_j$, a second bit line $EBL_j$, a word line $WL_{i-1,i}$, and two control gate lines $CGL_i$, $CGL_{i-1}$. The memory cell $C_{i,j}$ belongs to a physical page $P_i$ of the memory array and the memory cell $C_{i-1,j}$ belongs to an adjacent page $P_{i-1}$. The pages $P_i$, $P_{i-1}$ may comprise various other memory cells and the memory array MA1 may comprise various other pages.

The memory cell $C_i$, comprises two floating-gate transistors $TR_{i,j}$, $TE_{i,j}$ the floating gates FGr, FGe of which are interconnected, the floating-gate transistor $TR_{i,j}$ being dedicated to reading the transistor memory cell and the floating-gate transistor $TE_{i,j}$ being dedicated to erasing the memory cell. According to one embodiment, the floating gates FGr, FGe are interconnected by manufacturing the two floating gates from a same conductive element CFG.

The transistor $TR_{i,j}$ has a control gate CGr connected to the control gate line $CGL_i$, a drain terminal D connected to the bit line $RBL_j$ and a source terminal S connected to the drain terminal D of a select transistor ST the source terminal S of which is coupled to a source line SL. The transistor $TE_{i,j}$ has a control gate CGe connected to the control gate line $CGL_i$, a drain terminal D connected to the bit line $EBL_j$ and a source terminal S connected to the drain terminal D of a select transistor ST the source terminal S of which is coupled to a source line SL.

The memory cell $C_{i-1,j+1}$ has the same structure as the memory cell $C_{i,j}$ and comprises two floating-gate transistors $TR_{i-1,j}$, $TE_{i-1,j}$ the floating gates FGr, FGe of which are interconnected and/or formed by a same conductive element CFG. The transistor $TR_{i-1,j}$ has a control gate CGr connected to the control gate line $CGL_{i-1}$, a drain terminal D connected to the bit line $RBL_j$ and a source terminal S connected to the drain terminal D of a select transistor ST the source terminal S of which is coupled to a source line SL. The floating-gate transistor $TE_{i-1,j}$ has a control gate CGe connected to the control gate line $CGL_{i-1}$, a drain terminal D connected to the bit line $EBL_j$ and a source terminal S connected to the drain terminal D of a select transistor ST the source terminal S of which is coupled to a source line SL.

The select transistors ST associated with the floating-gate transistors $TR_{i,j}$, $TR_{i-1,j}$ have a common control gate CSG connected to the word line $WL_{i-1,j}$, that is preferentially produced in the form of a vertical gate embedded in a substrate receiving the memory array MA1. Similarly, the select transistors ST associated with the floating-gate transistors $TE_{i,j}$, $TE_{i-1,j}$ have a common embedded vertical control gate CSG that is connected to the word line $WL_{i-1,i}$. The memory cell $C_{i,j}$ is thus, structurally, equivalent to the combination of the memory cells $M_{i,j}$, $M_{i,j+1}$ shown on FIG. 1, the floating gates of which have been electrically coupled. Similarly, the memory cell $C_{i-1,j}$ is, structurally, equivalent to the combination of the memory cells $M_{i+1,j}$, $M_{i-1,j+1}$ shown on FIG. 1 the floating gates of which have been electrically coupled. The two memory cells may thus be referred to as "dual" memory cells. As their select transistors ST have the same control gate in pairs, these memory cells may also be referred to as "twin" memory cells.

However, the floating-gate transistor $TE_{i,j}$ differs from the floating-gate transistor $T_{i,j+1}$ of the memory cell $M_{i,j+1}$ in that it comprises a conductive region IS that extends opposite its floating gate FGe with interposition of a tunnel dielectric layer, and which is electrically coupled to its drain terminal D. Similarly, the floating-gate transistor $TE_{i-1,j}$ differs from the floating-gate transistor $T_{i-1,j+1}$ of the memory cell $M_{i-1,j+1}$ in that it comprises a conductive region IS that extends opposite its floating gate FGe through a tunnel dielectric layer, and which is electrically coupled to its drain terminal D.

Figure 3:
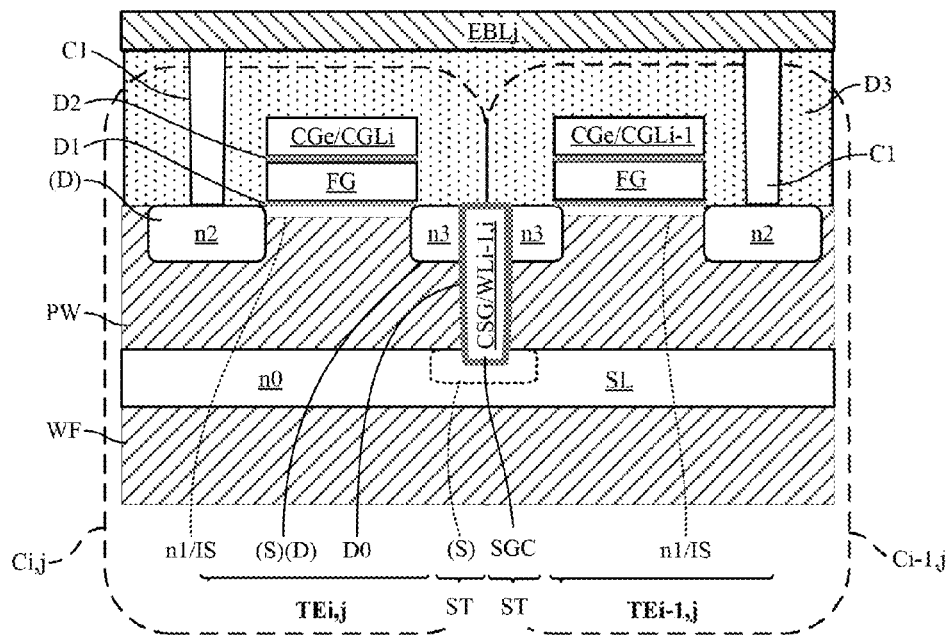
FIG. 3 is a cross-section of a memory cell in FIG. 2.

FIG. 3 is a cross-section of one embodiment of the transistors $TE_{i,j}$, $TE_{i-1,j}$ and of their respective select transistors ST. The floating-gate transistors are produced on a substrate PW, for example made of silicon, forming the upper region of a semiconductor chip WF. The chip WF is initially a wafer on which several integrated circuits are produced, which is then cut into individual chips.

The source lines SL of the select transistors ST are formed by a deep doped region n0 that here forms a collective source plane for the entire memory array. The common control gate CSG of the select transistors ST is formed with a conductive material, for example polysilicon (polycrystalline silicon), deposited in a trench made in the substrate, and isolated from the latter by a dielectric layer D0. This "conductive trench" also forms the word line $WL_{i-1,i}$ according to an axis perpendicular to the plane of the figure.

Figure 4:
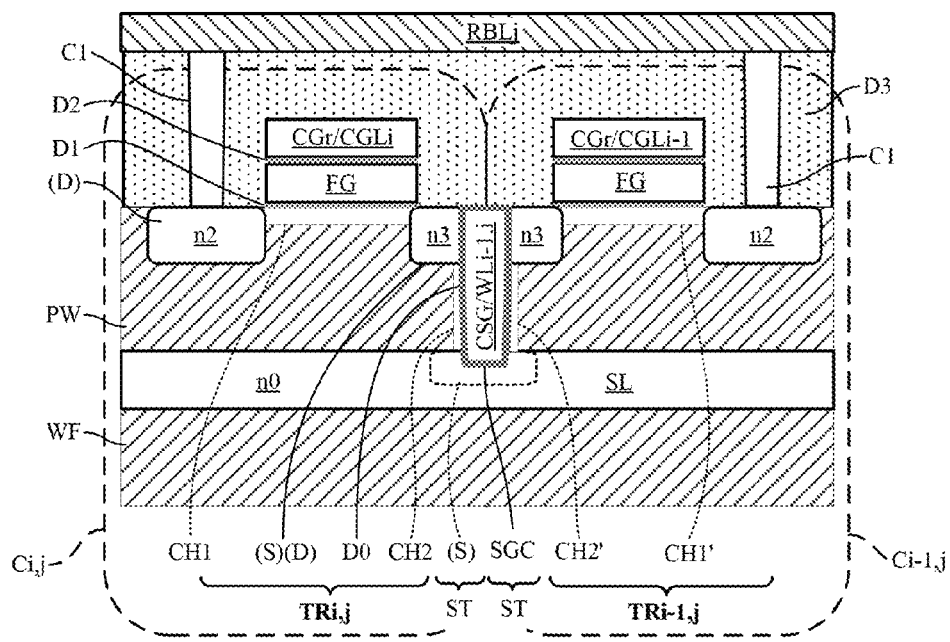
FIG. 4 is another cross-section of the memory cell.

The floating gates FGe of the transistors $TE_{i,j}$, $TE_{i-1,j}$ are arranged on either side of the trench CSG, and are supported by the substrate PW through a tunnel dielectric layer D1. They are formed here by a conductive part, for example made of polysilicon, which extends up to the transistors $TR_{i,j}$, $TR_{i-1,j}$ (not shown in this section plane, Cf. FIG. 4) to also form the floating gates of these transistors.

The control gates CGe of the transistors $TE_{i,j}$, $TE_{i-1,j}$ extend above the floating gates through a dielectric layer D2. They are formed here by conductive strips of polysilicon that also form the control gate lines $CGL_i$, $CGL_{i-1}$ according to an axis perpendicular to the plane of the figure.

Doped regions n2 and n3 implanted on either side of the gate stack FG/CGe respectively form the drain (D) and source (S) regions of the transistors $TE_{i,j}$, $TE_{i-1,j}$, the regions n3 also forming the drain regions (D) of the select transistors ST. The source regions (S) of the select transistors ST are here formed by the layer n0, the common vertical gate CSG of the select transistors extending here up to the region n0. In one alternative embodiment, the lower end of the conductive trench CSG does not reach the region n0 and a deep doped pocket is implanted between the trench and the layer n0 to form the source region of the select transistors ST.

The gate stacks FG/CGe of the transistors $TE_{i,j}$, $TE_{i-1,j}$ are covered with a dielectric layer D3 over which the bit line $EBL_j$ extends. Contacts C1 pass through the layer D3 to electrically couple the bit line $EBL_j$ to the drain regions n2 (D) of the transistors $TE_{i,j}$, $TE_{i-1,j}$. The conductive regions IS of the transistors $TE_{i,j}$, $TE_{i-1,j}$ are here doped regions n1 of the substrate which extend beneath the floating gates FG, between the drain n2 and source n3 regions of the transistors $TE_{i,j}$, $TE_{i-1,j}$, and are thus covered with the tunnel dielectric layer D1. The dielectric layers D0, D1, D2 and D3 are for example made of silicon dioxide SiO2.

FIG. 4 is a cross-section of the floating-gate transistors $TR_{i,j}$, $TR_{i-1,j}$ of the memory cells $C_{i,j}$, $C_{i-1,j}$ and of their respective select transistors ST. The structure of these transistors is essentially identical to that of the transistors $TE_{i,j}$, $TE_{i-1,j}$ and will not be described again. The control gates CGe of these transistors are formed by the polysilicon parts forming the control gate lines $CGL_i$, $CGL_{i-1}$ and their floating gates FG are formed by the same polysilicon parts as those forming the floating gates of the transistors $TE_{i,j}$, $TE_{i-1,j}$ (FIG. 3). Their drain regions n2 (D) are coupled by contacts C1 to the bit line $RBL_j$ which extends over the dielectric layer D3.

The transistors $TR_{i,j}$, $TR_{i-1,j}$ differ from the transistors $TE_{i,j}$, $TE_{i-1,j}$ in that they do not have the conductive region IS extending beneath the floating gate FG. Thus, when these transistors are biased by an appropriate gate voltage, a conducting channel CH1 or CH1' can form between the drain region n2 (D) and the source region n3 (S). A vertical conducting channel CH2 or CH2' can also form between the drain n3 (D) and source (S) regions of the select transistor ST if the common vertical gate CSG of these transistors simultaneously receives a bias voltage. More particularly, the vertical channel region CH2 of the select transistor ST of the memory cell $C_{i,j}$ extends opposite a first face of the embedded vertical control gate CSG, and the vertical channel region CH2' of the select transistor ST of the memory cell $C_{i-1,j}$ extends opposite a second face of the embedded vertical control gate, and thus opposite the channel region CH2 of the select transistor of the memory cell Ci,j.

The transistors $TR_{i,j}$, $TR_{i-1,j}$ may also differ from the transistors $TE_{i,j}$, $TE_{i-1,j}$ by the thickness of their tunnel dielectric layer D1, which can be different from the one that extends beneath the floating gates of the transistors $TE_{i,j}$, $TE_{i-1,j}$ this choice being offered to those skilled in the art depending on the method selected for programming the memory cells, i.e., by Fowler Nordheim effect by means of the transistors $TE_{i,j}$, $TE_{i-1,j}$ or by hot-electron injection by means of the transistors $TR_{i,j}$, $TR_{i-1,j}$, these two options being described below.

Unlike the transistors $TR_{i,j}$, $TR_{i-1,j}$, the transistors $TE_{i,j}$, $TE_{i-1,j}$ cannot have any conducting channel CH1 controlled by the voltage applied to them, due to the fact that the region extending between their drain n2 and source n3 regions is short-circuited by the doped region n1 (FIG. 3). These transistors are thus always on whatever their gate voltage, and cannot be used to read the memory cells $C_{i,j}$, $C_{i-1,j}$. However, they can be used to erase the memory cells in conditions where no drain-source current passes through them, i.e., by Fowler Nordheim effect. They may also be used to program the memory cells in conditions where no drain-source current passes through them, i.e., also by Fowler Nordheim effect, as it will be seen below.

As a result, the select transistors ST associated with the transistors $TE_{i,j}$, $TE_{i-1,j}$ are not used and are present here only to streamline the manufacturing of the memory cells, in accordance with one embodiment of a manufacturing method described below. It may indeed be simpler to produce a useless transistor within a set of transistors used, when the non-production of the useless transistor would involve additional masking and photolithography steps. As, firstly, these select transistors are on when the word line $WL_{i-1,j}$ to which they are connected receives a positive voltage, and as, secondly, the floating-gate transistors $TE_{i,j}$, $TE_{i-1,j}$ are always on due to their region IS, one should, when designing the control units of the memory, ensure that the corresponding bit line $EBL_j$ cannot simultaneously receive a voltage different from zero.

In short, the transistor $TE_{i,j}$ can be used as transistor for erasing the memory cell $C_{i,j}$ by Fowler Nordheim effect, which involves a static programming without any programming current, whereas the transistor $TR_{i,j}$ can be used as transistor for reading the memory cell. Similarly, the transistor $TE_{i-1,j}$ can be used as transistor for erasing the memory cell $C_{i-1,j}$ by Fowler Nordheim effect and the transistor $TR_{i-1,j}$ can be used as transistor for reading the memory cell. The bit line $RBL_j$ can be used as bit line for reading and the bit line $EBL_j$ as bit line for erasing the memory cell $C_{i,j}$ or the memory cell $C_{i-1,j}$.

As regards the programming of the memory cells $C_{i,j}$, $C_{i-1,j}$ some embodiments of the present disclosure provide two methods, to be chosen by those skilled in the art, i.e., a programming method by Fowler Nordheim effect by means of the erase transistor $TE_{i,j}$ or $TE_{i-1,j}$, or a programming method by hot-electron injection by means of the read transistor $TR_{i,j}$ or $TR_{i-1,j}$.

Methods for erasing, programming and reading cells of the memory array MA1 will be described below, assuming as an example that the memory cell $C_{i,j}$ is to be erased, programmed and read.

Erasing of a Memory Cell by Fowler Nordheim Effect Via the Erase Transistor $TE_{i,j}$ A method for erasing the memory cell $C_{i,j}$ without erasing the memory cell $C_{i-1,j}$, via the erase transistor $TE_{i,j}$, is described in Table 1 of the Annex, which is an integral part of the description.

Figure 5:
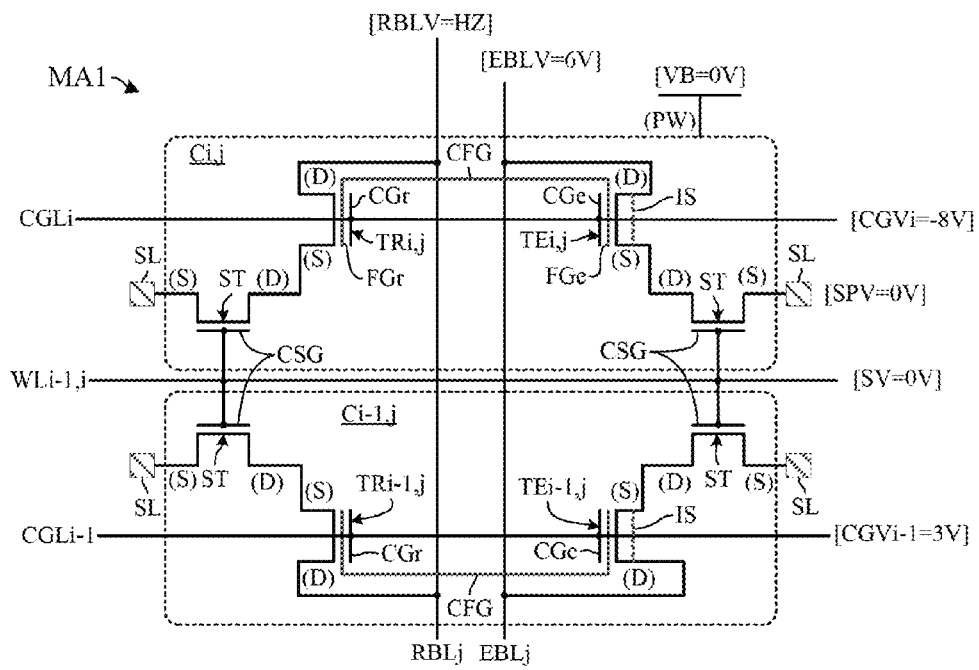
FIG. 5 shows voltages applied to the memory array in FIG. 2 to erase a memory cell.
Figure 6:
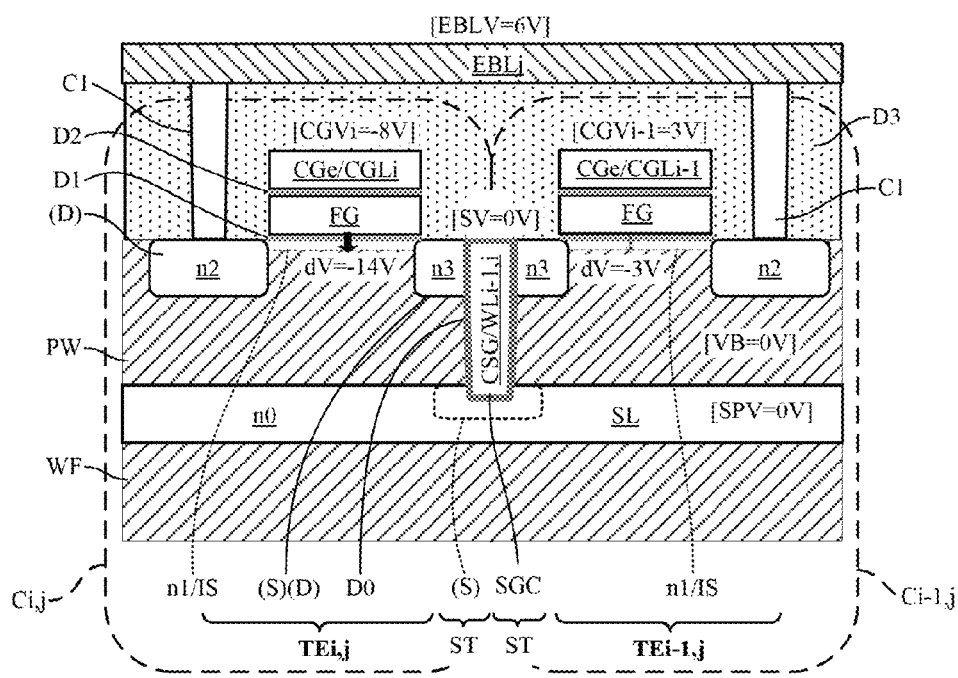
FIG. 6 is a cross-section of a memory cell in FIG. 5, and shows voltages applied to the memory cell.

FIGS. 5 and 6 show this erasing method. FIG. 5 is the wiring diagram of FIG. 2 in which the voltage values contained in Table 1 have been entered. FIG. 6 is a cross-section of the transistors $TE_{i,j}$, $TE_{i-1,j}$ identical to that of FIG. 3, in which the voltage values contained in Table 1 have been entered.

The conductive region IS of the transistor $TE_{i,j}$ is taken to the positive voltage EBLV applied to the bit line $EBL_j$, here 6V, through the contact C1 and the drain region n1 (D) of the transistor. As the control gate CGe of the transistor $TE_{i,j}$ is taken to the negative voltage $CGV_i$, here −8V, a voltage difference dV equal to −14V (FIG. 6) appears between this control gate and the conductive region IS which causes electrons to be extracted from the floating gate FGe by Fowler Nordheim effect, which puts the transistor $TE_{i,j}$ to the erased state. As the bit line $RBL_j$ connected to the floating-gate transistor $TR_{i,j}$ is at high impedance, this transistor does not play any role in the process of erasing the memory cell. As the floating gate of the transistor $TR_{i,j}$ is however electrically coupled to that of the transistor $TE_{i,j}$, the transfer of electric charges also causes the erasing of the transistor $TR_{i,j}$, the entire memory cell $C_{i,j}$ being thus erased through the transistor $TE_{i,j}$.

The conductive region IS of the transistor $TE_{i-1,j}$ of the twin memory cell $C_{i-1,j}$ is also taken to the positive voltage EBLV applied to the bit line $EBL_j$, here 6V, through the contact C1 and the drain region n1 (D) of the transistor. As the control gate CGe of the transistor $TE_{i-1,j}$ is taken to the positive voltage $CGV_{i-}$, here 3V, a voltage difference dV equal to −3V appears between this control gate and the conductive region IS, which is insufficient to extract electrons from the floating gate of the transistor. The twin memory cell $C_{i-1,j}$ is thus not erased.

This memory array and memory cell structure thus enables individual erasing of each memory cell, i.e., erasing by bit. This possibility allows a memory erasable by bit, by word or by page to be produced indifferently without changing the general structure of the memory array or of its control units.

Figure 7:
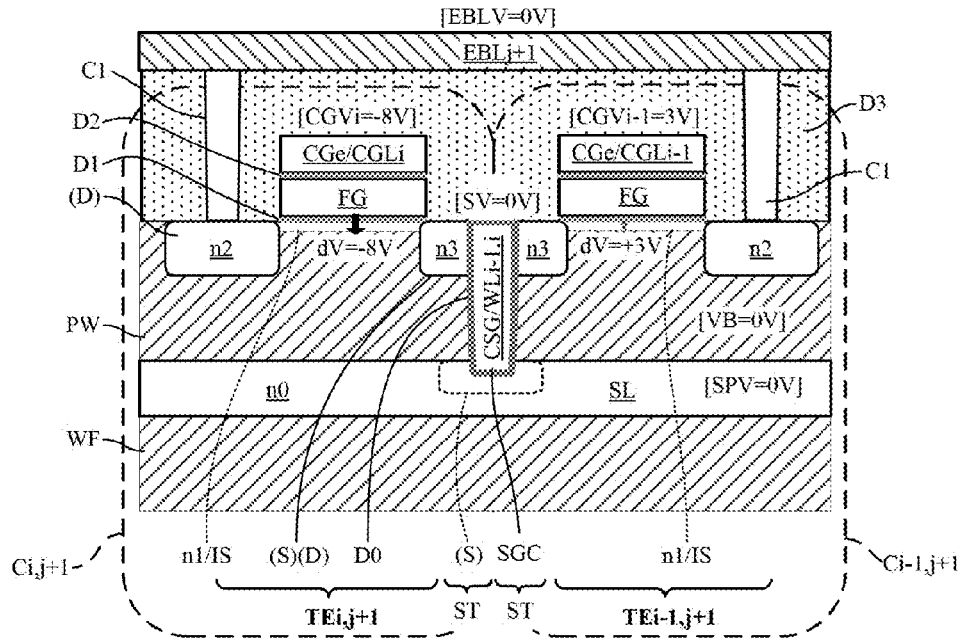
FIG. 7 is another cross-section of the memory cell, and shows the voltages applied to the memory cell.

FIG. 7 is a cross-section of two transistors $TE_{i,j+1}$, $TE_{i-1,j+1}$ of two memory cells $C_{i,j+1}$, $C_{i-1,j+1}$ (not represented on FIG. 2 or 5) that are contiguous to the memory cells $C_{i,j}$, $C_{i-1,j}$. The memory cells $C_{i,j+i}$, $C_{i-1,j+1}$ are connected to the same word line $WL_{i-1,i}$ as the memory cells $C_{i,j}$, $C_{i-1,j}$ but are connected to a different bit line $EBL_{j+1}$ that receives the default voltage EBLV*, here 0V. The transistors $TE_{i,j+i}$, $TE_{i-1,j+1}$ have their control gates CGe connected to the same control gate lines $CGL_i$, $CGL_{i-1}$ as the transistors $TE_{i,j}$, $TE_{i-1,j}$ and thus receive the same voltages $CGV_i$, here −8V, and $CGV_{i-i}$, here 3V. Thus, the voltage difference dV between the control gate CGe of the transistor $TE_{i,j+i}$ and its conductive region IS is equal to −8V and this transistor undergoes an erasing stress, i.e., a low-intensity spurious erasing that could, if the transistor were in the programmed state, and after many cycles of erasing other memory cells coupled to the control gate lines $CGL_i$, $CGL_{i-1}$, substantially alter its threshold voltage and thus cause a corruption of its state, and thus a corruption of the data bit associated with the programmed state.

Furthermore, the voltage difference dV between the control gate CGe of the transistor $TE_{i-1,j+1}$ and its conductive region IS is 3V and this transistor does not undergo any erasing stress, the control gate line $CGL_{i-1}$ being taken to only 3V. Similarly, default voltages applied to the memory cells connected to other word lines WL (not represented on the figures) do not cause any erasing stress in these memory cells.

Finally, the erasing method according to the present disclosure not only enables each memory cell to be individually erased, but also limits the appearance of an erasing stress to the memory cells connected to the same control gate line, whereas various other known erasing methods, enabling only erasing by word, or otherwise by page, also cause an erasing stress to the memory cells connected to other word lines. The management of the erasing stress, by methods for refreshing the memory cells known per se, is thus simplified, given the smaller number of memory cells to be refreshed. It is possible, for example, to decide to initiate a sequence for refreshing the memory cells of a word line after N cycles of programming memory cells of this word line, by providing an erase cycle counter associated with the word line.

Programming of a Memory Cell by Fowler Nordheim Effect Via the Erase Transistor $TE_{i,j}$ A method for programming the memory cell $C_{i,j}$ without programming the memory cell $C_{i-1,j}$ via the erase transistor $TE_{i,j}$, is described by Table 2 in the Annex.

Figure 8:
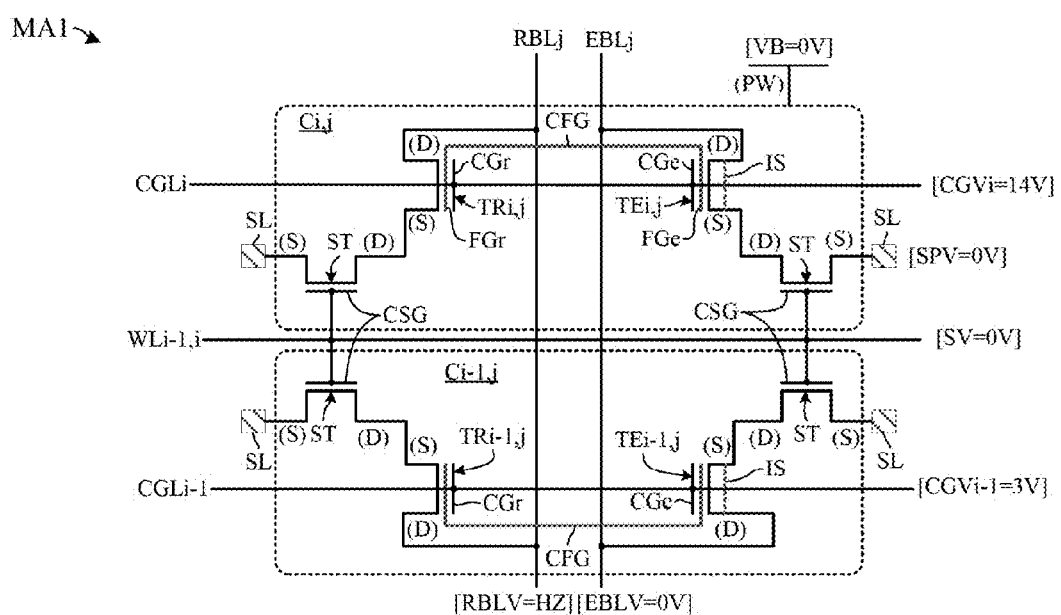
FIG. 8 shows voltages applied to the memory array in FIG. 2 to program a memory cell by Fowler Nordheim effect.
Figure 9:
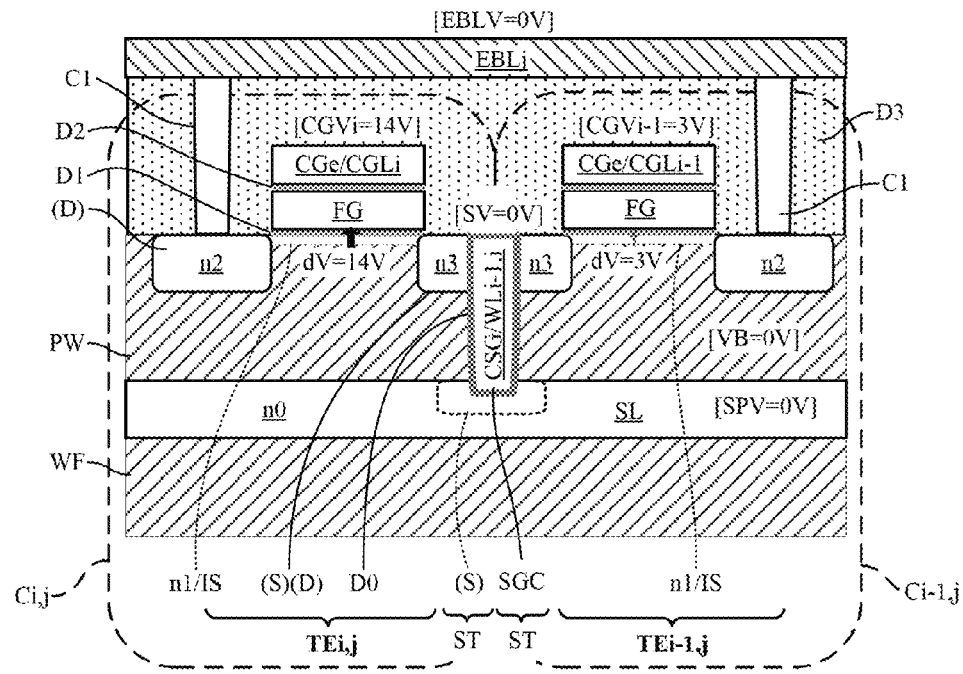
FIG. 9 is a cross-section of a memory cell in FIG. 8 and shows voltages applied to the memory cell.

FIGS. 8 and 9 show this programming method. FIG. 8 is the wiring diagram in FIG. 2 in which the voltage values contained in Table 2 have been entered. FIG. 9 is a cross-section of the transistors $TE_{i,j}$, $TE_{i-1,j}$ identical to that of FIG. 3, in which the voltage values contained in Table 2 have been entered.

The conductive region IS of the transistor $TE_{i,j}$ is taken to the voltage EBLV applied to the bit line $EBL_j$, here 0V, through the contact C1 and the drain region n1 (D) of the transistor. As the control gate CGe of the transistor $TE_{i,j}$ is taken to the positive voltage $CGV_i$, here 14V, a positive voltage difference dV equal to 14V (FIG. 9) appears between this control gate and the conductive region IS which causes electrons to be injected into the floating gate FGe by Fowler Nordheim effect, which puts the transistor $TE_{i,j}$ to the programmed state. As the bit line $RBL_j$ connected to the floating-gate transistor $TR_{i,j}$ is at high impedance, this transistor does not play any role in the process of programming the memory cell. As the floating gate of the transistor $TR_{i,j}$ is however electrically coupled to that of the transistor $TE_{i,j}$, the transfer of electric charges also causes the programming of the transistor $TR_{i,j}$, the entire memory cell $C_{i,j}$ being thus programmed through the transistor $TE_{i,j}$.

The conductive region IS of the transistor $TE_{i-1,j}$ of the twin memory cell $C_{i-1,j}$ is taken to the voltage EBLV applied to the bit line $EBL_j$, here 0V, through the contact C1 and the drain region n1 (D) of the transistor. As the control gate CGe of the transistor $TE_{i-1,j}$ is taken to the positive voltage $CGV_{i-}$, here 3V, a voltage difference dV equal to 3V appears between this control gate and the conductive region IS, which is insufficient to inject electrons of the floating gate of the transistor. The twin memory cell $C_{i-1,j}$ is thus not programmed.

Figure 10:
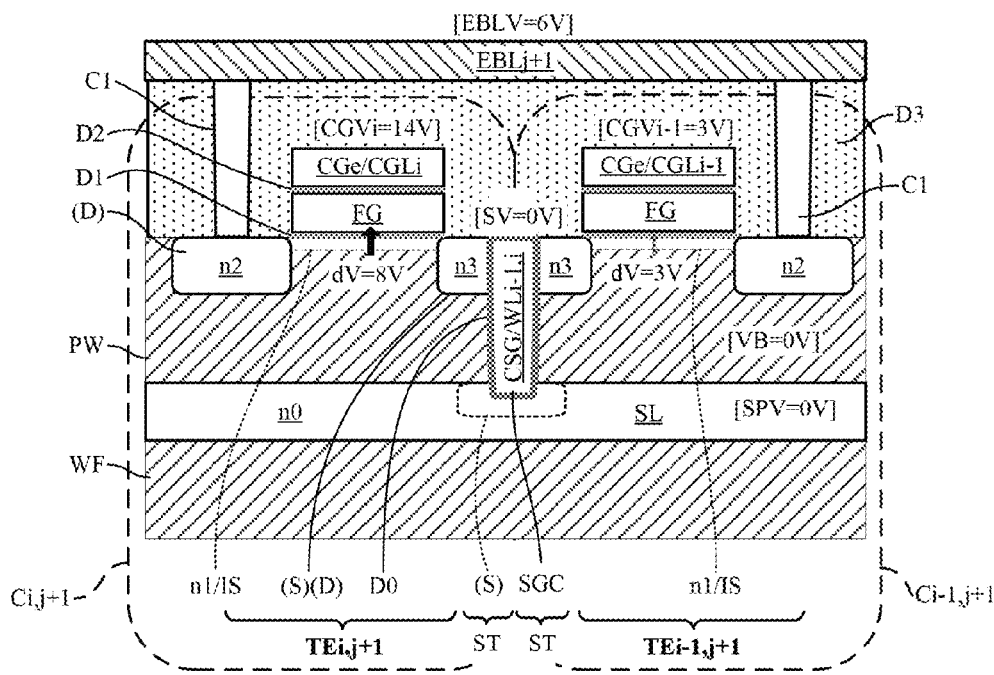
FIG. 10 is another cross-section of the memory cell and shows the voltages applied to the memory cell.

FIG. 10 is a cross-section of the transistors $TE_{i,j+1}$, $TE_{i-1,j+1}$ of the neighboring memory cells $C_{i,j+1}$, $C_{i-1,j+1}$ already described in connection with FIG. 7, connected to the same word line $WL_{i-1,i}$ as the memory cells $C_{i,j}$, $C_{i-1,j}$ but connected to the neighboring bit line $EBL_{j+1}$ that receives the default voltage EBLV*, here 6V. The transistors $TE_{i,j+i}$, $TE_{i-1,j+1}$ have their control gates CGe connected to the same control gate lines $CGL_i$, $CGL_{i-1}$ as the transistors $TE_{i,j}$, $TE_{i-1,j}$ and thus receive the same voltages $CGV_i$, here 14V, and $CGV_{i-1}$, here 3V. Thus, the voltage difference dV between the control gate CGe of the transistor $TE_{i,j+1}$ and its conductive region IS is 8V and this transistor undergoes a programming stress, i.e., a low-intensity spurious programming.

Furthermore, the voltage difference dV between the control gate CGe of the transistor $TE_{i-1,j+1}$ and its conductive region IS is 3V and this transistor does not undergo any programming stress, the control gate line $CGL_{i-1}$ being taken to only 3V. Similarly, default voltages applied to the memory cells connected to other word lines WL (not represented on the figures) do not cause any programming stress in these memory cells.

Finally, this programming method, like the erasing method previously described, only causes an electrical stress to the memory cells connected to the same control gate line, the effects of which can be cancelled out by a refreshing method of the above-mentioned type.

Programming of a Memory Cell by Hot-Electron Injection Via the Read Rransistor $TR_{i,j}$ A method for programming the memory cell $C_{i,j}$ without programming the memory cell $C_{i-1,j}$, via the read transistor $TR_{i,j}$, is described by Table 3 in the Annex.

Figure 11:
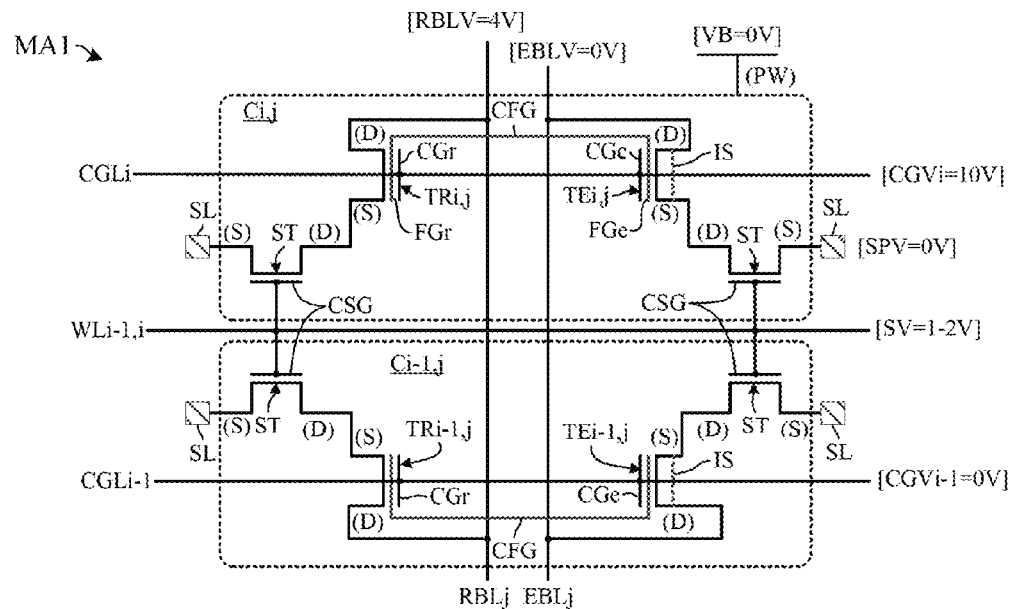
FIG. 11 shows voltages applied to the memory array in FIG. 2 to program a memory cell by hot-electron injection.
Figure 12:
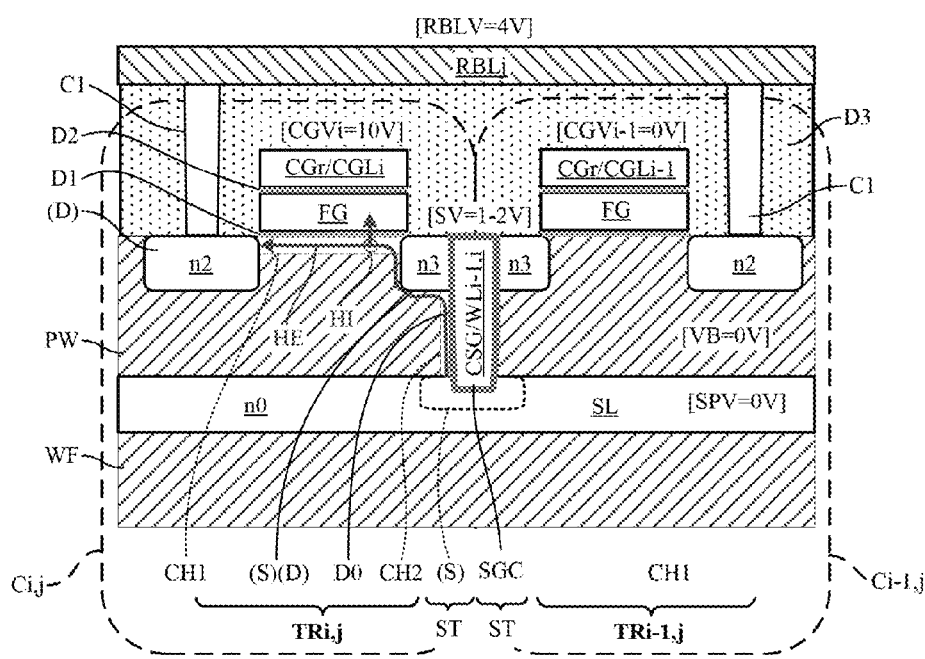
FIG. 12 is a cross-section of a memory cell in FIG. 11 and shows voltages applied to the memory cell.

FIGS. 11 and 12 show this programming method. FIG. 11 is the wiring diagram in FIG. 2 in which the voltage values contained in Table 3 have been entered. FIG. 12 is a cross-section of the transistors $TR_{i,j}$, $TR_{i-1,j}$ identical to that of FIG. 4, in which the voltage values contained in Table 3 have been entered.

The transistor $TR_{i,j}$ receives the positive voltage $CGV_i$, here 10V, on its control gate and is in the on state, the conducting channel CH1 appearing in the substrate PW beneath the gate stack FG/CGr. The select transistor ST associated with the transistor $TR_{i,j}$ receives the positive select voltage SV, here 1 to 2V, on its embedded vertical gate CSG, and is in the on state, the vertical conducting channel CH2 appearing opposite the gate CSG. As the bit line $RBL_j$ is taken to the positive voltage RBLV, here 4V, and the source line SL is coupled to the ground (0V), a current circulates from the bit line to the source line through the transistor $TR_{i,j}$ and the corresponding select transistor ST. This current corresponds to a flow of electrons HE shown on FIG. 12, in the opposite direction to the direction of the current. This flow of electrons contains high kinetic energy electrons (hot electrons) that bypass the doped region n3 ("cold" region). Some of these electrons are injected into the floating gate at an injection point HI, causing the programming of the transistor $TR_{i,j}$, and the programming of the erase transistor $TE_{i,j}$ that does not play any role in the programming process here. However, the transistor $TR_{i-1,j}$ of the twin cell receives the voltage $CGV_{i-1}$ that is equal to 0V, such that it does not undergo any spurious programming process, nor any of the other read transistors of the memory array, which receive only zero voltages.

Reading of a Memory Cell Via the Read Transistor $TR_{i,j}$

A method for reading the memory cell $C_{i,j}$ via the read transistor $TR_{i,j}$, is described by Table 4 in the Annex.

Figure 13:
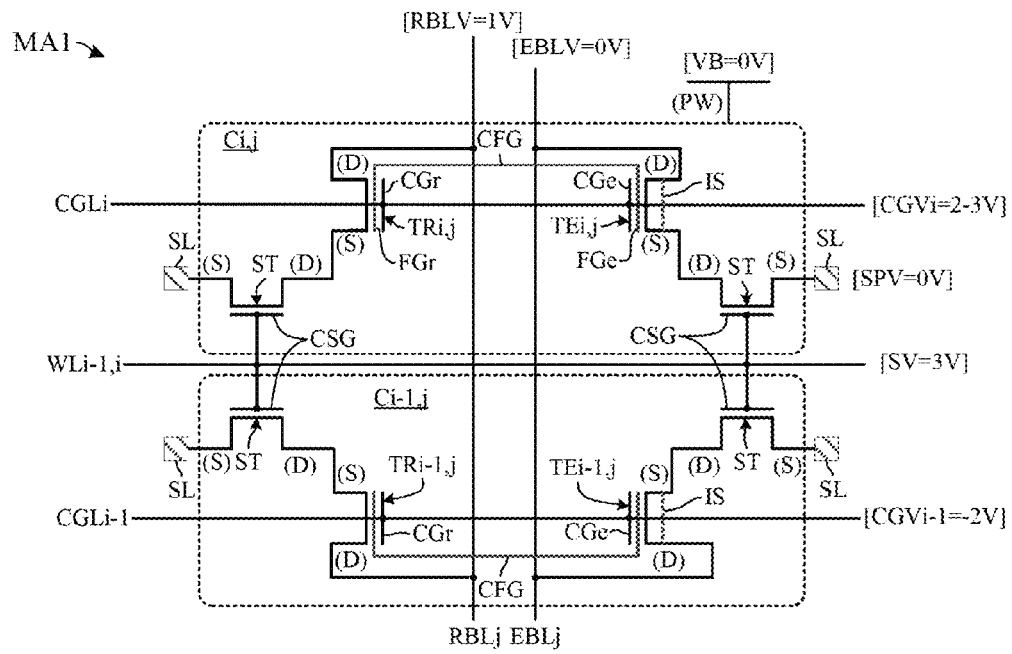
FIG. 13 shows voltages applied to the memory array in FIG. 2 to read a memory cell.
Figure 14:
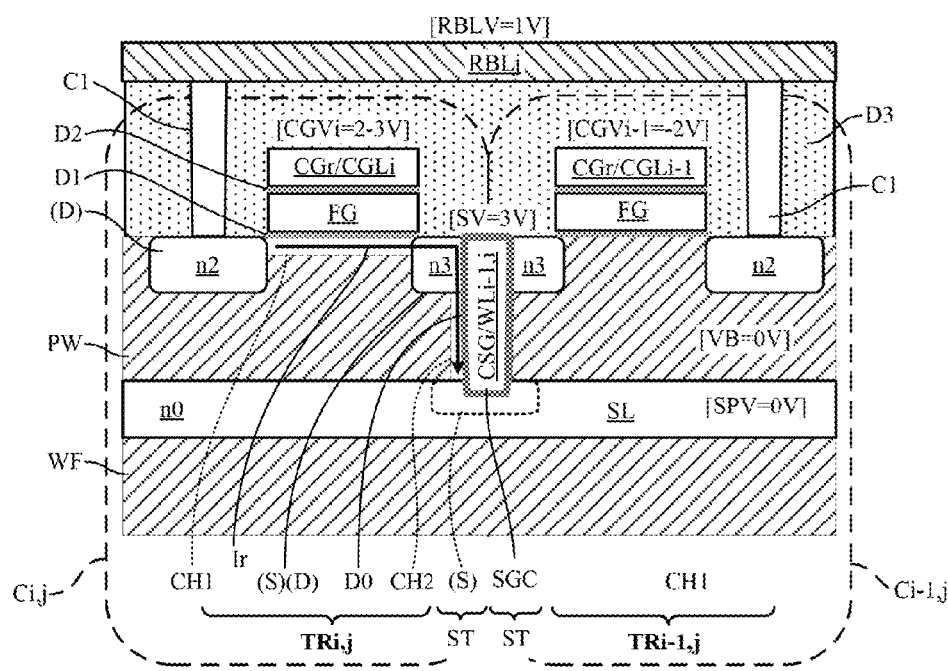
FIG. 14 is a cross-section of a memory cell in FIG. 13 and shows voltages applied to the memory cell.

FIGS. 13 and 14 show this reading method. FIG. 13 is the wiring diagram in FIG. 2 in which the voltage values contained in Table 4 have been entered. FIG. 14 is a cross-section of the transistors $TR_{i,j}$, $TR_{i-1,j}$ identical to that of FIG. 4, in which the voltage values contained in Table 4 have been entered.

The transistor $TR_{i,j}$ receives the positive voltage $CGV_i$, here 2 to 3V, that is lower than the threshold voltage of the programmed transistor but greater than the threshold voltage of the erased transistor. If the transistor $TR_{i,j}$ is in the erased state, i.e., if it has a threshold voltage Vt lower than the voltage $CGV_i$, the conducting channel CH1 appears in the substrate PW, beneath the gate stack FG/CGr. The select transistor ST associated with the transistor $TR_{i,j}$ receives the positive select voltage SV, here 3V, on its embedded vertical gate CSG, and is in the on state, the vertical conducting channel CH2 appearing opposite the embedded gate CSG. As the bit line $RBL_j$ is taken to the positive voltage RBLV, here 1V, and the source line SL is coupled to the ground (0V), the transistor $TR_{i,j}$ is passed through by a read current Ir that circulates from the bit line to the source line. However, this current Ir is zero if the transistor $TR_{i,j}$ is in the programmed state, i.e., if it has a threshold voltage greater than the voltage $CGV_i$. A current amplifier (not represented) connected to the bit line $RBL_j$ enables the presence or absence of the current Ir to be detected, and the erased or programmed state of the transistor $TR_{i,j}$ to thus be deduced, to which a logical value, 0 or 1, is allocated by convention.

The transistor $TR_{i-1,j}$ of the twin memory cell receives the negative voltage $CGV_{i-1}$, here −2V. This transistor, if it is in the erased state, can have a threshold voltage close to zero. The application of a negative gate control voltage ensures that it remains in the off state. Indeed, as this transistor is connected to the same bit line $RBL_j$ as the transistor $TR_{i,j}$ being read, rendering it conducting could corrupt the reading of the transistor $TR_{i,j}$.

Figure 15:
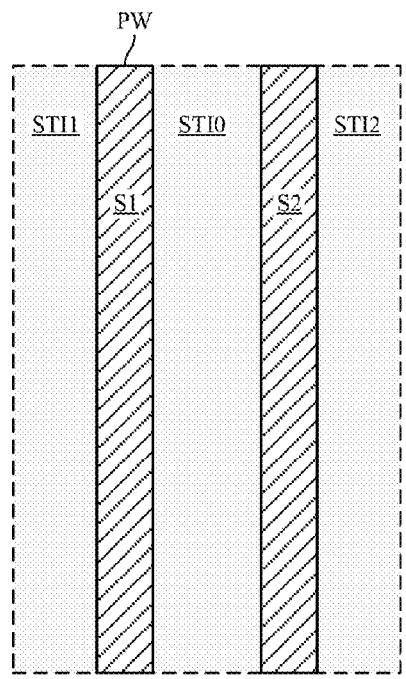
FIGS. 15 to 24 show steps of a method for manufacturing a memory cell shown on FIGS. 2 to 4.

FIGS. 15 to 22 show steps of a method for manufacturing the memory cells $C_{i,j}$, $C_{i-1,j}$ described above. FIG. 15 shows a preliminary step of forming in the substrate PW three isolating trenches STI0, ST1, ST2 of STI type ("Shallow Trench Isolation") that delimit two strips of substrate S1, S2 in which the memory cells will be produced. This step is preceded by a step of implanting in the substrate the embedded layer n0 forming a source plane (not shown on the figure) or of implanting several source lines. A source plane is generally preferred to multiple source lines if it is provided to erase the memory cells by hot-electron injection.

Figure 16:
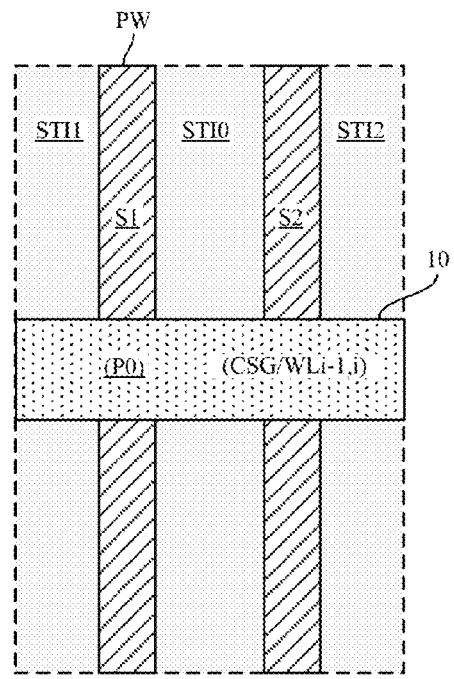

During a step shown on FIG. 16, a conductive trench is formed transversally to the strips S1, S2, by etching the substrate, depositing the dielectric layer D0 (not shown) and depositing a polysilicon layer P0 and etching the latter. The trench is intended to form both the word line $WL_{i-1,j}$ and the embedded vertical control gate of the select transistors ST of the memory cells.

Figure 17:
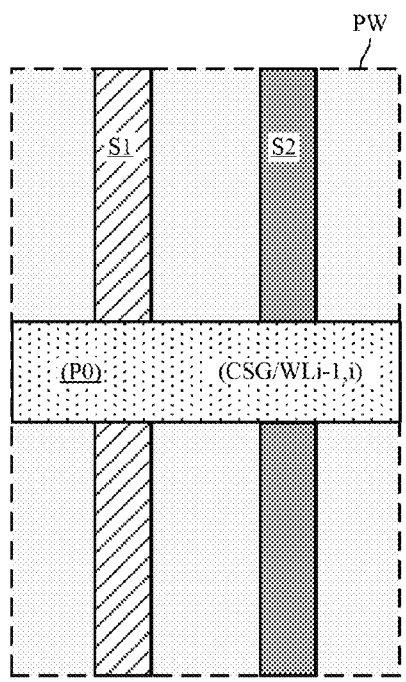

During a step shown on FIG. 17, the strip of substrate S2 is doped by implanting N-type dopants, the strip of substrate S1 being masked during this operation. This step makes it possible to produce the conductive region IS that will extend beneath the floating gate of the erase transistors $TE_{i,j}$, $TE_{i-1,j}$.

Figure 18:
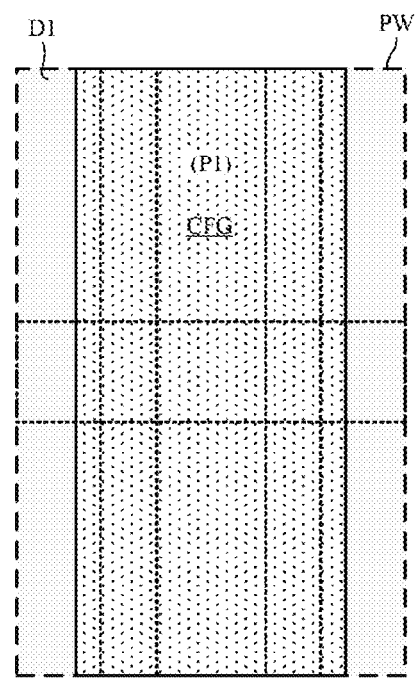

During a step shown on FIG. 18, the tunnel dielectric layer D1 described above is deposited on the substrate PW, then a strip of polysilicon P1, intended to form floating gates, is deposited on the strips of substrate S1 and S2.

Figure 19:
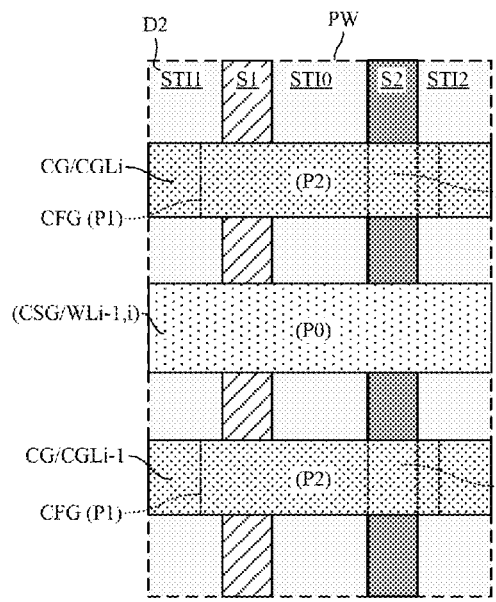

During a step shown on FIG. 19, the dielectric layer D2 is deposited on the substrate PW, then a polysilicon layer P2 is deposited on the layer D2. The layer P2 is then etched with the layer D2 as well as with the layer P1 to form the control gate lines $CGL_i$, $CGL_{i-1}$, and, beneath the latter, the common floating gates CFG, resulting from the simultaneous etching of the layer P1.

Figure 20:
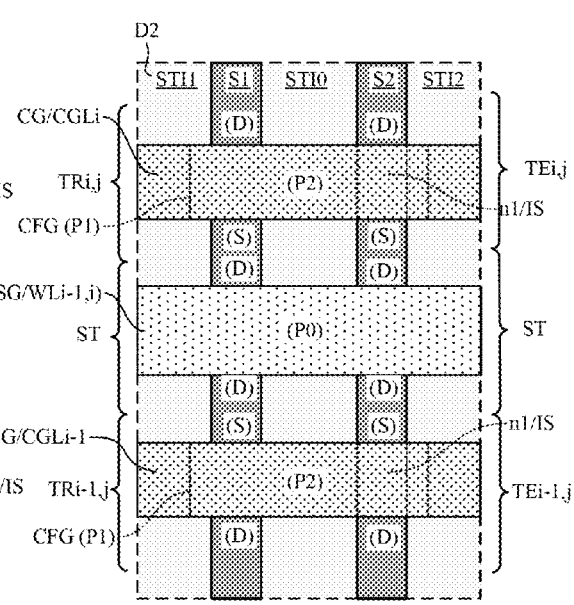

During a step shown on FIG. 20, the strips of substrate S1, S2 are doped by implanting dopants self-aligned with the control gate lines $CGL_i$, $CGL_{i-1}$ and with the word line $WL_{i-1,i}$, the strip of substrate S2 thus being doped a second time. This step generates the source S and drain D regions of the transistors $TR_{i,j}$, $TR_{i-1,j}$, $TE_{i,j}$, $TE_{i-1,j}$, and the drain regions of the select transistors ST.

Figure 21:
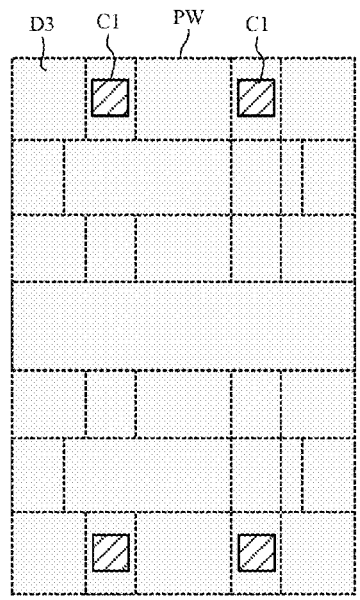

During a step shown on FIG. 21, the dielectric layer D3 is deposited on the substrate and orifices are made in the layer D3, and are then plated through to form the contacts C1. Contacts C1 extend above the drain regions D of the transistors $TR_{i,j}$, $TR_{i-1,j}$ and others above the drain regions D of the transistors $TE_{i,j}$, $TE_{i-1,j}$.

Figure 22:
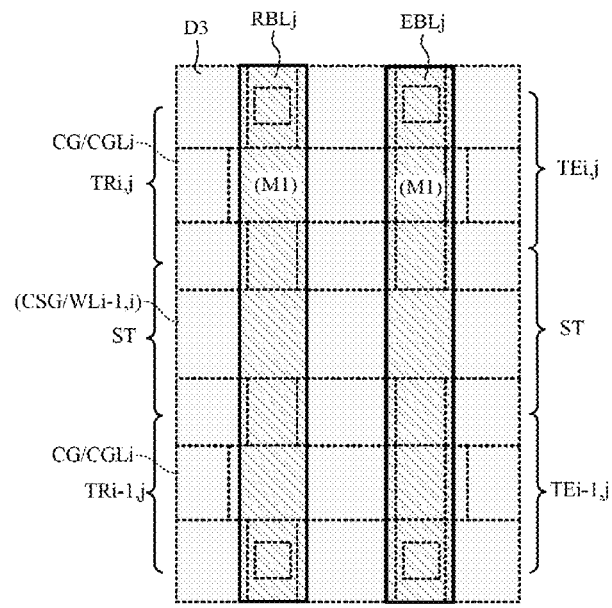

During a step shown on FIG. 22, a metal layer M1 ("metal 1") is deposited on the substrate, and is then etched to obtain two conductive strips that form the bit lines $RBL_j$ and $EBL_j$, the former being arranged on the contacts C1 produced above the drain regions D of the transistors $TR_{i,j}$, $TR_{i-1,j}$ and the latter arranged on the contacts produced above the drain regions D of the transistors $TE_{i,j}$.

Figure 23:
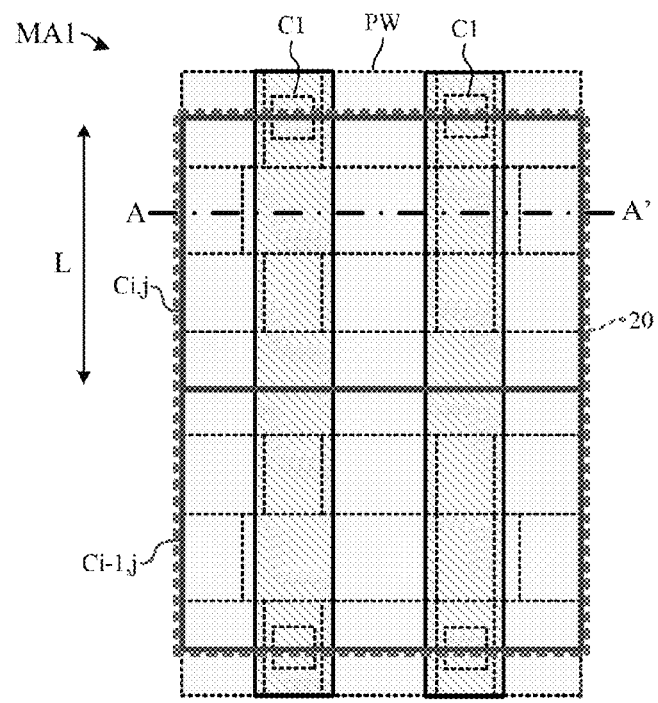

FIG. 23 is identical to FIG. 22 and shows the surface area occupied in width W and in length L by each memory cell $C_{i,j}$, $C_{i-1,j}$, the assembly forming a "basic brick" 20 of the memory array, containing two twin dual cells, the repetition of which enables a memory array MA1 of variable size chosen according to the intended application to be designed. As the contacts C1 are in this case shared by memory cells produced above and below the memory cells $C_{i,j}$, $X_{i-1,j}$ ("above" and "below" meaning in relation to the plane in the figure), which are not represented, only half of the surface area occupied by the contacts C1 is considered to be part of the "basic brick" 20.

Although these memory cells $C_{i,j}$, $C_{i-1,j}$ have a surface area that is twice those shown on FIG. 1, those skilled in the art will note that the semiconductor surface area they occupy barely differs from that occupied by conventional memory cells having planar-type select transistors that are not shared, due to the fact that the embedded vertical select gates considerably reduce their surface area and even more to the fact that they are shared.

Furthermore, according to one embodiment of the present disclosure, a memory array according to the present disclosure may comprise a first memory area produced from memory cells as described on FIG. 1, forming a page-erasable mass memory, and a second memory area produced from memory cells according to the present disclosure, forming a bit- or word-erasable data memory, offering a finer erasing granularity than the mass memory and more suited to certain applications.

Figure 24:
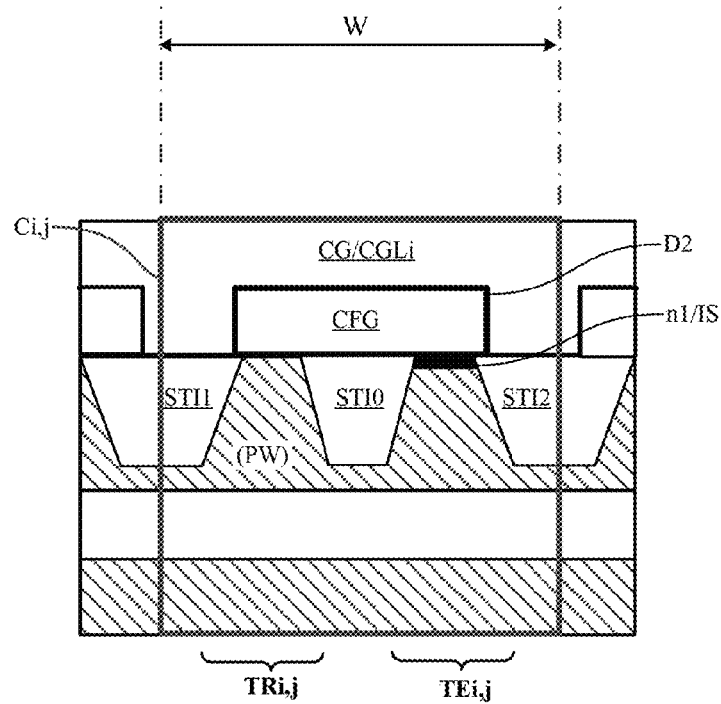

FIG. 24 is a cross-section of the memory cell $C_{i,j}$ according to a section plane AA' shown on FIG. 23 and perpendicular to the section plane of FIGS. 3 and 4, together showing the transistors $TR_{i,j}$, $TE_{i,j}$ and their common floating gate FGT. This figure also shows that it is possible to further reduce the width W of the memory cell by reducing the width of the central isolating trench STI0 that separates the transistors $TR_{i,j}$, $TE_{i,j}$, this isolating trench not needing to have the isolation width usually chosen for the trenches STI1, STI2 that separate neighboring memory cells, since the transistors $TR_{i,j}$, $TE_{i,j}$ are electrically coupled.

Figure 25:
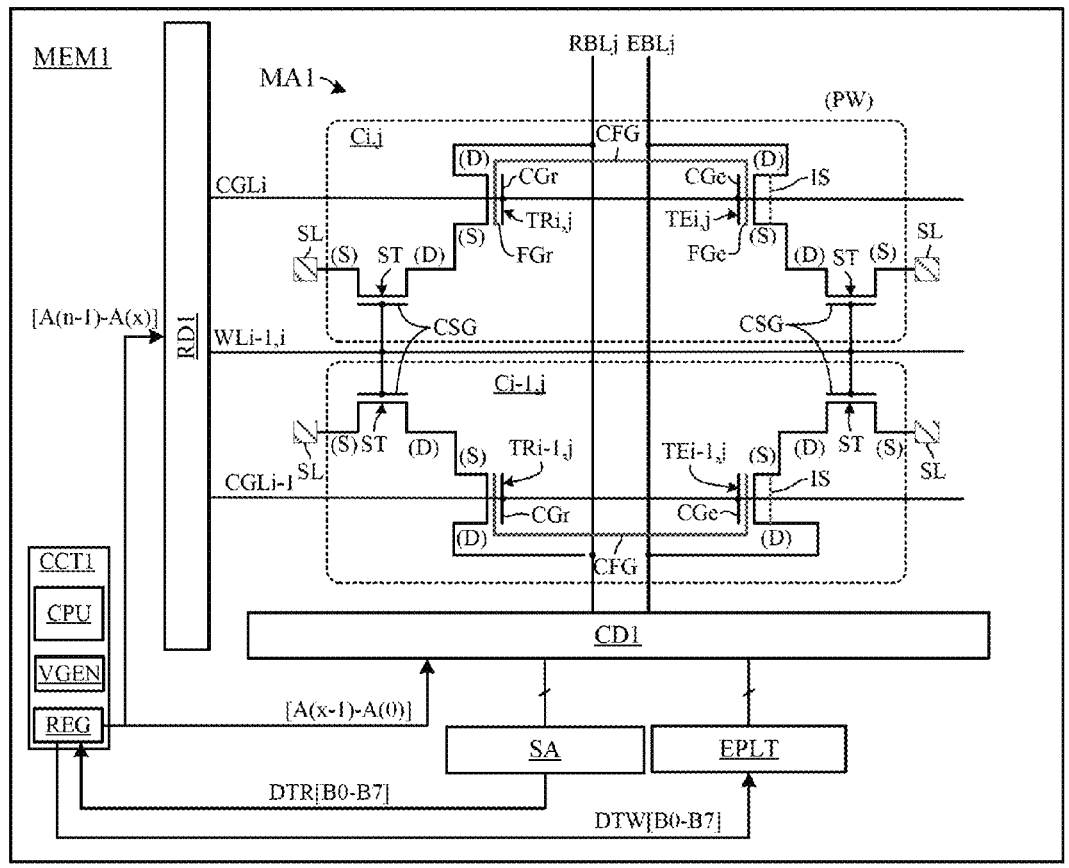
FIG. 25 is the wiring diagram of a memory comprising the memory array in FIG. 2.

FIG. 25 is the wiring diagram of a memory MEM1 comprising the memory array MA1 according to the present disclosure, only the cells $C_{i,j}$, $C_{i-1,j}$ being represented. The memory comprises a control circuit CCT1, a word line decoder RD1, a column decoder CD1, as many sense amplifiers SA as the number of bits of a word DTR to be read in the memory, for example an eight-bit word B0-B7, and erase or program latches EPLT.

If the programming method selected is the programming method by hot-electron injection described above, the latches EPLT and the column decoder CD1 are configured to apply programming voltages to the bit lines $RBL_j$ or to apply erase voltages to the bit lines $EBL_j$, depending on the value of the bits of a word DTW to be written or to be erased in the memory, for example an eight-bit word B0-B7.

If the programming method selected is the programming method by Fowler Nordheim effect described above, the latches EPLT and the column decoder CD1 are configured to apply programming voltages or erase voltages to the bit lines $EBL_j$, depending on the value of the bits of a word DTW to be written or to be erased in the memory.

The word line decoder RD1 controls the voltages applied to the control gate lines $CGL_i$, $CGL_{i-1}$ and to the word line $WL_{i-1,i}$ according to a most significant address A(n-1)-A(x) of a word, or line address. The decoder CD1, in combination with the latches EPLT, controls the voltages applied to the bit lines $RBL_j$, $EBL_j$ according to a least significant address A(x-1)-A(0) of the word, or column address, the line and column addresses forming together the address A(n-1)-A0 of a word to be read or to be written in the memory array. The memory is thus structurally bit-erasable, but can be configured to be only word-erasable as regards the erasing capabilities offered to the end user.

In read mode, the decoder CD1 couples the sense amplifiers SA to the bit lines $RBL_j$ coupled to the memory cells to be read, and the sense amplifiers supply the word DTR.

The circuit CCT1 comprises for example a central unit CPU, a voltage generator VGEN, and address and data registers REG. It executes read or write commands, controls the decoders, latches, sense amplifiers, supplies the voltages required for the read or write operations (erasing and programming), supplies the decoders with the most significant and least significant addresses, and if necessary executes a program for refreshing the memory cells.

Although the improvement that has just been described was initially designed to be applied to a memory cell structure of the type represented in FIG. 1, it will be understood by those skilled in the art that some embodiments of this improvement may be applied to other types of memory cells.

Figure 26:
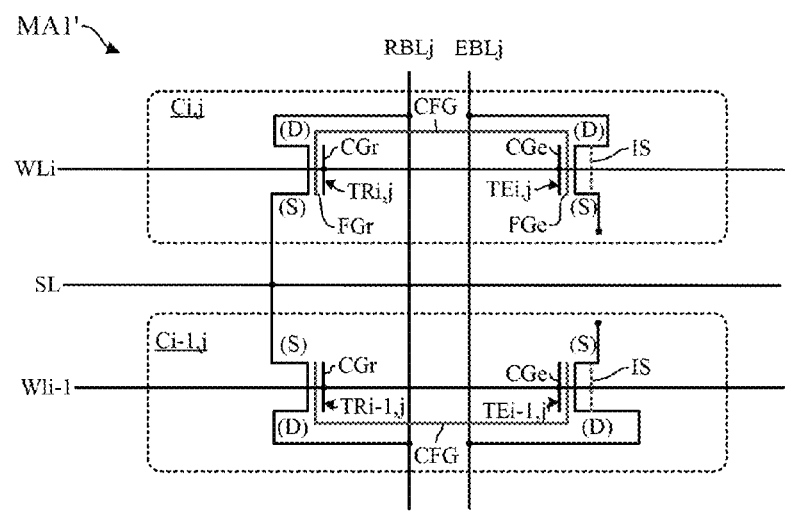
FIG. 26 is the wiring diagram of a second embodiment of a memory array and memory cell structure according to the present disclosure.

As an example, FIG. 26 represents one embodiment of this improvement applied to memory cells without any select transistor. The memory array MA1' represented comprises memory cells $C_{i,j}$, $C_{i-1,j}$ each comprising a floating-gate transistor $TR_{i,j}$, respectively $TR_{i-1,j}$ and a floating-gate transistor $TE_{i,j}$, respectively $TE_{i-1,j}$, of the same structure as those described above. The transistor $TR_{i,j}$ has a drain terminal connected to the bit line $RBL_j$, a control gate CGr connected to the word line $WL_i$, and a source terminal directly connected to the source line SL. The transistor $TE_{i,j}$ comprises a drain terminal connected to the bit line $EBL_j$, a control gate CGr connected to the word line $WL_i$ and a non-connected source terminal. As above, the floating gate FGr of the transistor $TR_{i,j}$ is electrically coupled to the floating gate FGe of the transistor $TE_{i,j}$ and the latter comprises the conductive region IS opposite its floating gate, enabling the memory cell to be erased. The memory cell $C_{i-1,j}$ has an identical structure and the description above applies by replacing the index i with the index i-1.

Other alternatives could be provided, for example by removing the source terminal of the transistors $TE_{i,j}$, $TE_{i-1,j}$ in the embodiment in FIG. 26 or in the embodiment in FIG. 2, or by removing the select transistors ST associated with the transistors $TE_{i,j}$, $TE_{i-1,j}$ in the embodiment in FIG. 2.

Figure 27:
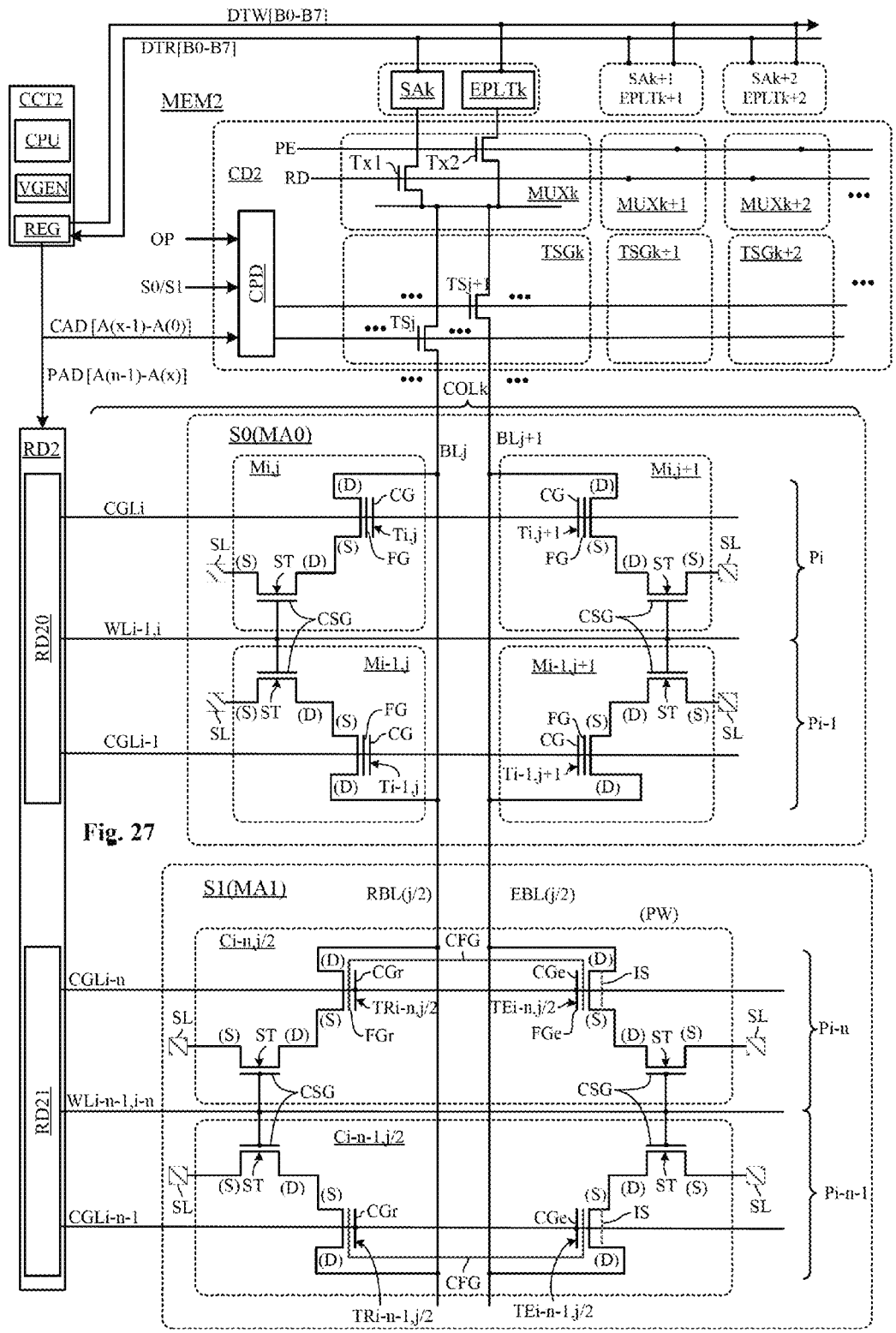
FIG. 27 is the wiring diagram of a page-erasable or word-erasable composite memory comprising the memory array in FIG. 1 and the memory array in FIG. 2.

FIG. 27 represents one embodiment of a composite memory MEM2 according to the present disclosure, comprising:
- a sector S0 receiving a memory array MA0 of the type described above in connection with FIG. 1 and
- a sector S1 receiving a memory array MA1 of the type described above in connection with FIG. 2.

The two memory arrays are preferably produced in two different wells, for example P wells, so as to be able to apply different electric potentials to their respective substrates.

The memory cells of the sector S0 are channel-erased, in the manner described in US application 2013/0228846, by putting the substrate to a positive erase voltage causing electric charges to be extracted from the floating gates of memory cells. The sector S0 can be configured to be page-erasable or sector-erasable; in the latter case, all the memory cells of the sector S0 are erased at the same time. The memory cells of the sector S0 can furthermore be channel-programmed, i.e., by Fowler-Nordheim effect, as described in the above-mentioned application, or be programmed by hot-electron injection through bit lines. This second option has been selected in the embodiment described here.

The memory cells of the sector S1 are erased in the manner described above, through erase bit lines EBL. Again as described above, they can be programmed by Fowler-Nordheim effect, through erase bit lines, or be programmed by hot-electron injection, through read bit lines RBL. This second option has been selected in the embodiment described here.

The sector S0 is thus a page- or sector-erasable sector, whereas the sector S1 is a bit-erasable sector. The sector S1 can however be configured to be only word-erasable as regards the erasing capabilities offered to the end user.

For the sake of simplicity of the drawing, in the memory array MA0 only the two pairs of twin memory cells described above $M_{i,j}$, $M_{i-1,j}$ are shown, respectively $M_{i,j+1}$, $M_{i-1,j+1}$, belonging here to two adjacent physical pages $P_i$, $P_{i-1}$. The memory cells $M_{i,j}$, $M_{i-1,j}$, $M_{i,j+1}$, $M_{i-1,j+1}$ are coupled to bit lines $BL_j$, $BL_{j+1}$, to a word line $WL_{i-1,i}$ and to control gate lines $CGL_i$, $CGL_{i-1}$. Each memory cell comprises a floating-gate transistor, respectively $T_{i,j}$, $T_{i-1,j}$, $T_{i,j+1}$, $T_{i-1,j+1}$. The drain terminals D of the transistors $T_{i,j}$, $T_{i-1,j}$ are connected to the bit line $BL_j$ and the drain terminals of the transistors $T_{i,j+1}$, $T_{i-1,j+1}$ are connected to the bit line $BL_{j+1}$. The control gates CG of the transistors $T_{i,j}$, $T_{i,j+1}$ are connected to the control gate line $CGL_i$ and the control gates CG of the floating-gate transistors $T_{i-1,j}$, $T_{i-1,j+1}$ are connected to the control gate line $CGL_{i-1}$. Each floating-gate transistor $T_{i,j}$, $T_{i-1,j}$, $T_{i,j+1}$, $T_{i-1,j+1}$ has its source terminal coupled to a source line SL through a select transistor ST. The select transistors ST of the twin memory cells $M_{i,j}$, $M_{i-1,j}$, respectively $M_{i,j+1}$, $M_{i-1,j+1}$ share the same control gate CSG, here a vertical gate embedded in the substrate receiving the memory array MA0 and connected to a word line $WL_{i-1,i}$.

Equally, in the memory array MA1 only two memory cells $C_{i-n,j/2}$, $C_{i-n-1,j/2}$ of the same structure as the cells $C_{i,j}$, $C_{i-1,j}$ described above are shown. The memory cells $C_{i-n,j/2}$, $C_{i-n-1,j/2}$ are read-, program- and erase-accessible via a first bit line $RBL_{j/2}$, a second bit line $EBL_{j/2}$, a word line $WL_{i-n-1,i-n}$, and two control gate lines $CGL_{i-n}$, $CGL_{i-n--}$. The memory cell $C_{i-n,j/2}$ belongs to a physical page $P_{i-n}$ of the memory array MA1 and the memory cell $C_{i-n-1,j/2}$ belongs to an adjacent page $P_{i-n-1}$. The memory cell $C_{i-n,j/2}$ comprises two floating-gate transistors $TR_{i-n,j/2}$, $TE_{i-n,j/2}$ the floating gates FGr, FGe of which are interconnected and/or formed by a same conductive element CFG. Similarly, the memory cell $C_{i-n-1,j/2}$ comprises two floating-gate transistors $TR_{i-m-1,j/2}$, $TE_{i-n-1,j/2}$ the floating gates FGr, FGe of which are interconnected and/or formed by a same conductive element CFG. As described above, each transistor $TE_{i-n,j/2}$, $TE_{i-n-1,j/2}$ comprises a conductive region IS which extends opposite its floating gate FGe with interposition of a tunnel dielectric layer, the region IS being electrically coupled to its drain terminal D.

The transistor $TR_{i-n,j/2}$ has a control gate CGr connected to the control gate line $CGL_{i-n}$, a drain terminal D connected to the bit line $RBL_{j/2}$ and a source terminal S connected to the drain terminal D of a select transistor ST the source terminal S of which is coupled to a source line SL. The transistor $TE_{i-n,j/2}$ has a control gate CGe connected to the control gate line $CGL_{i-n}$, a drain terminal D connected to the bit line $EBL_{j/2}$ and a source terminal S connected to the drain terminal D of a select transistor ST the source terminal S of which is coupled to a source line SL. The transistor $TR_{i-n-1,j/2}$ has a control gate CGr connected to the control gate line $CGL_{i-n-1}$, a drain terminal D connected to the bit line $RBL_{j/2}$ and a source terminal S connected to the drain terminal D of a select transistor ST the source terminal S of which is coupled to a source line SL. The transistor $TE_{i-n-1,j/2}$ has a control gate CGe connected to the control gate line $CGL_{i-n-}$, a drain terminal D connected to the bit line $EBL_{j/2}$ and a source terminal S connected to the drain terminal D of a select transistor ST the source terminal S of which is coupled to a source line SL. The select transistors ST associated with the floating-gate transistors $TR_{i-n,j/2}$, $TR_{i-n-1,j/2}$ have a common control gate CSG connected to a word line $WL_{i-n-1,i-n}$, here a vertical gate embedded in the substrate receiving the memory array MA1. Similarly, the select transistors ST associated with the floating-gate transistors $TE_{i-n,j/2}$, $TE_{i-n-1,j/2}$ have a common embedded vertical control gate CSG that is connected to the word line $WL_{i-n-1,i-n}$.

It is possible to refer to FIG. 3 described above as cross-section of one embodiment of the transistors $TE_{i-n,j/2}$, $TE_{i-n-1,j/2}$ and of their select transistors ST, the latter being identical to the transistors $TE_{i,j}$, $TE_{i-1,j}$, ST represented. Similarly, it is possible to refer to FIG. 4 as cross-section of one embodiment of the transistors $TR_{i-n,j/2}$, $TR_{i-n-1,j/2}$ and of their select transistors ST, the latter being identical to the transistors $TR_{i,j}$, $TR_{i-1,j}$, ST represented.

According to one aspect of the present disclosure enabling the composite memory MEM2 to be seen from the external environment as a unit memory, i.e., to be accessible using a same address input irrespective of the sector S0 or S1 targeted, the sectors S0 and S1, or at least one part thereof, share the same bit lines. Thus, in the example of an embodiment represented, the conductive line forming the bit line $BL_j$ of the memory array MA0 extends up to the memory array MA1 where it forms the bit line $RBL_{j/2}$. Similarly, the conductive line forming the bit line $BL_{j-1}$ of the memory array MA0 extends up to the memory array MA1 where it forms the bit line $EBL_{j/2}$.

More generally, by designating an index formed by a whole and even number by "j", this composite memory structure results in the possibility of using the bit lines $BL_j$ of rank "j" (i.e., j=0, 2, 4, 8) to read or program by hot-electron injection memory cells of the memory array MA0, and of using them, as bit lines $RBL_{j/2}$ of rank j/2 (i.e., j/2=0, 1, 2, 3, 4 . . . ), to read or program by hot-electron injection memory cells of the memory array MA1, in the manner described above.

Furthermore, the bit lines $BL_{j+1}$ of odd rank "j+1" (i.e., j+1=1, 3, 5, 7) can be used to read or program by hot-electron injection the memory cells of the memory array MA0, and can be used, as bit lines $EBL_{j/2}$ of rank j/2 (i.e., j=0, 1, 2, 3, 4 . . . ), to erase by Fowler Nordheim effect memory cells of the memory array MA1. In one alternative embodiment, these bit lines could also be used to program by Fowler Nordheim effect memory cells of the memory array MA1, in accordance with the method described above.

As the memory cells $C_{i-n,j/2}$, $C_{i-n-1,j/2}$ are each coupled to two bit lines RBL, EBL, the number of bits that can be stored by a page Pi-n, Pi-n-1 of the memory array MA1 is equal to half the number of bits that can be stored by a page Pi, Pi−1 of the memory array MA0, for an identical number of bit lines passing through the two memory arrays MA0, MA1. More particularly, for an identical word size in each of the sectors, if each of the pages of the first sector S0 comprises N2 words of N1 bits each, the pages of the second sector S1 then comprise N2/2 words of N1 bits each.

The structure of the composite memory array of the memory MEM2 can also be organized in the same way as FLASH memories, by grouping together in columns all the memory cells receiving bits of the same rank of binary words stored by the memory. For example, as shown on FIG. 27, the composite memory array is organized into N1 columns $COL_k$ of rank k, k being a column index ranging from 0 to N1-1 corresponding to the number of bits per word (for example k=0 to 7 for eight-bit words). Each column $COL_k$ comprises N2 bit lines $BL_j$, $BL_{j+1}$ (j then being an index varying from 0 to N2-2 and j+1 an index varying from 1 to N2-1), N2 corresponding to the number of words per page. In the memory array MA0 each bit line $BL_j$ or $BL_{j+1}$ is coupled to memory cells of rank j or j+1 containing bits of the same rank. In the memory array MA1, each pair of bit lines $BL_j$, $BL_{j+1}$, forming a pair of bit lines $RBL_{j/2}$, $EBL_{j/2}$, is coupled to memory cells of rank j containing bits of the same rank. Each page of the memory array MA0 can then receive N2 page-erasable words of N1 bits each, and each page of the memory array MA1 can receive N2/2 words of N1 bits each.

The memory MEM2 also comprises control units enabling memory cells to be read, programmed or erased in any one of the sectors S0 or S1, using an address of n bits A(n-1)-A0 supplied to the memory. In the example shown on FIG. 27, these units comprise a control circuit CCT2, a word line decoder RD2, a column decoder CD2, sense amplifiers $SA_k$ with one amplifier per column $COL_k$, and erasing or programming latches $EPLT_k$ with one latch per column. The column decoder CD2 comprises a column predecoder CPD, demultiplexers $MUX_k$ with one demultiplexer per column, and groups of select transistors $TSG_k$ with one group per column.

The circuit CCT2 comprises for example a central unit CPU, a voltage generator VGEN, and address and data registers REG. It executes read or write commands, controls the decoders, supplies the voltages required for the read or write operations (erasing-programming), supplies the decoders with the most significant and least significant addresses, and if necessary executes a program for refreshing the memory cells.

A group of transistors $TSG_k$ of a column $COL_k$ comprises one select transistor $TS_j$, $TS_{j+1}$ per bit line $BL_j$, $BL_{j+1}$, to couple the bit line to the input of the demultiplexer $MUX_k$. The select transistors are driven by selection signals supplied by the column predecoder CDP. The demultiplexer comprises two transistors-switches Tx1, Tx2. The transistor Tx1 couples the input of the demultiplexer $MUX_k$ to the sense amplifier $SA_k$ allocated to the column $COL_k$, the output of which is coupled to a data bus conveying the words DTR read in the memory. The transistor Tx2 couples the input of the demultiplexer $MUX_k$ to the latch $EPLT_k$ allocated to the column $COL_k$, the output of which is coupled to a data bus conveying words DTW to be written in the memory.

The predecoder CPD receives, in addition to a column address CAD (bits of addresses A(x-1)-A(0)) designating the location of the bits of the word in each column, a signal S0/S1 indicating in which sector a read-, erase- or program-selected word is located, and an operation signal OP indicating whether the operation in progress is a read, erase or program operation.

The transistor Tx1 is driven by a read signal (RD) which renders the transistor on when the memory is in read mode. In this case, a bit line of the column $COL_k$ is coupled to the sense amplifier $SA_k$, through a select transistor TS. The predecoder CPD is configured so that this bit line is any line of the column if the word to be read is located in the sector S0, or an even bit line if the word to be read is located in the sector S1, i.e., a read bit line RBL of the sector S1.

The transistor Tx2 is driven by a program-erase signal (PE) which renders the transistor on when the memory performs an erase or program operation. In this case, a bit line of the column $COL_k$ can be selected and coupled to the latch $EPLT_k$ through a select transistor TS. More particularly, the predecoder CPD is configured in the following manner:
- if the operation in progress is a programming operation and if the word to be erased is located in the sector S0, any line of the column $COL_k$, designated by the column address, is selected,
- if the operation in progress is a programming operation and if the word to be erased is located in the sector S1, an even line of the column $COL_k$, i.e., a read bit line RBL of the sector S1, designated by the column address, is selected,
- if the operation in progress is an erase operation and if the word to be erased is located in the sector S0, no bit line is selected, the erasing then being managed by the line decoder RD2 for a global erase of the page in question or of the sector,
- if the operation in progress is an erase operation and if the word to be erased is located in the sector S1, an odd line of the column $COL_k$, i.e., an erase bit line EBL of the sector S1, designated by the column address, is selected.

The decoder RD2 receives a word line address PAD or page address, comprising most significant bits A(n-1)-A(x), and can be divided into two decoder parts RD20 and RD21, the part RD20 being allocated to the control of the word lines $WL_{i-1,i}$ of the sector S0 and the part RD21 being allocated to the control of the word lines $WL_{i-1,i-n}$ of the sector S1. The part RD20 is then configured to erase the pages of the sector S0 in addition to selecting them, by applying to the non-selected word lines appropriate erase-inhibit voltages (if a page-erase is targeted). The part RD21 only manages the selection of the pages containing memory cells to be read, erased or programmed, since the erasing is individually performed via the bit lines.

The composite memory MEM2 that has just been described offers the advantage of the sector S0 being usable for example for the fast recording of large data, such as images or programs, and the sector S1 being usable for example for the fast recording of small data, for example the variables of a program, or any data comprising a low number of words. It is susceptible of various applications and in particular of the so-called "embedded memory" applications, i.e., applications for integrating a memory into a semiconductor chip receiving a microcontroller. A program for optimizing the memory space can be provided to decide whether data to be stored must be saved in the sector S0 or in the sector S1 depending on their nature or on the nature of the operation the microcontroller executes.

ANNEX

TABLE 1

Fowler Nordheim erasing of $C_{i,j}$ via $TE_{i,j}$, FIGS. 5 and 6

| Ref. | Description | Sign | Example |
|---|---|---|---|
| $CGV_i$ | Erase voltage applied to the control gate $CGL_i$ of the transistors $TR_{i,j}$, $TE_{i,j}$ of the memory cell $C_{i,j}$ (erase-selected memory cell) via the control gate line $CGL_i$ | negative | -8 V |
| $CGV_{i-1}$ | Erase-inhibit voltage applied to the control gate $CGL_{i-1}$ of the transistors $TR_{i-1,j}$, $TE_{i-1,j}$ of the memory cell $C_{i-1,j}$ (twin memory cell not erase-selected) via the control gate line $CGL_i$ | positive | 3 V |
| EBLV | Erase voltage applied to the bit line $EBL_j$ | positive | 6 V |
| RBLV | Voltage applied to the bit line $RBL_j$ | — | HZ (*) |
| SV | Select voltage applied to the word line $WL_{i-1,i}$ common to the twin memory cells $C_{i-1,j}$, $C_{i,j}$ | — | 0 V |
| SPV | Source line voltage applied to all the source lines SL (or to the source plane) | — | 0 V |
| VB | Electric potential of the substrate PW | — | 0 V |
| CGV* | Default voltage applied to all the other control gate lines CGL | positive | 3 V |
| EBLV* | Default voltage applied to the non-selected bit lines EBL | — | 0 V |
| RBLV* | Default voltage applied to a non-selected bit line RBL | — | 0 V |
| SV* | Voltage applied to the non-selected word lines WL | — | 0 V |

(*) High impedance, i.e., line disconnected from the rest of the circuit

TABLE 2

Fowler Nordheim programming of $C_{i,j}$ via $TE_{i,j}$, FIGS. 8 and 9

| Ref. | Description | Sign | Example |
|---|---|---|---|
| $CGV_i$ | Voltage applied to the control gate $CGL_i$ of the transistors $TR_{i,j}$, $TE_{i,j}$ of the memory cell $C_{i,j}$ (program-selected memory cell) via the control gate line $CGL_i$ | positive | 14 V |

TABLE 2-continued

Fowler Nordheim programming of $C_{i,j}$ via $TE_{i,j}$, FIGS. 8 and 9

| Ref. | Description | Sign | Example |
|---|---|---|---|
| $CGV_{i-1}$ | Voltage applied to the control gate $CGL_{i-1}$ of the transistors $TR_{i-1,j}$, $TE_{i-1,j}$ of the memory cell $C_{i-1,j}$ (twin memory cell not program-selected) via the control gate line $CGL_i$ | positive | 3 V |
| EBLV | Voltage applied to the bit line $EBL_j$ | — | 0 V |
| RBLV | Voltage applied to the bit line $RBL_j$ | — | HZ |
| SV | Select voltage applied to the word line $WL_{i-1,i}$ common to the twin memory cells $C_{i-1,j}$, $C_{i,j}$ | — | 0 V |
| SPV | Source line voltage applied to all the source lines SL (or to the source plane) | — | 0 V |
| VB | Electric potential of the substrate PW | — | 0 V |
| CGV* | Voltage applied to all the other control gate lines CGL | positive | 3 V |
| EBLV* | Voltage applied to the non-selected bit lines EBL | — | 6 V |
| RBLV* | Voltage applied to the non-selected bit lines RBL | — | HZ |
| SV* | Voltage applied to the non-selected word lines WL | — | 0 V |

TABLE 3

Programming of $C_{i,j}$ by injection, via $TR_{i,j}$, FIGS. 11 and 12

| Ref. | Description | Sign | Example |
|---|---|---|---|
| $CGV_i$ | Voltage applied to the control gate $CGL_i$ of the transistors $TR_{i,j}$, $TE_{i,j}$ of the memory cell $C_{i,j}$ (program-selected memory cell) via the control gate line $CGL_i$ | positive | 10 V |
| $CGV_{i-1}$ | Voltage applied to the control gate $CGL_{i-1}$ of the transistors $TR_{i-1,j}$, $TE_{i-1,j}$ of the memory cell $C_{i-1,j}$ (twin memory cell not program-selected) via the control gate line $CGL_i$ | — | 0 V |
| EBLV | Voltage applied to the bit line $EBL_j$ | — | 0 V or more |
| RBLV | Voltage applied to the bit line $RBL_j$ | positive | 4 V |
| SV | Select voltage applied to the word line $WL_{i-1,i}$ common to the twin memory cells $C_{i-1,j}$, $C_{i,j}$ | positive | 1-2 V |
| SPV | Source line voltage applied to all the source lines SL (or to the source plane) | — | 0 V |
| VB | Electric potential of the substrate PW | — | 0 V |
| CGV* | Voltage applied to all the other control gate lines CGL | — | 0 V |
| EBLV* | Voltage applied to the non-selected bit lines EBL | — | 0 V |
| RBLV* | Voltage applied to the non-selected bit lines RBL | — | 0 V |
| SV* | Voltage applied to the non-selected word lines WL | — | 0 V |

TABLE 4

Reading of $C_{i,j}$ via $TR_{i,j}$, FIG. 13 and 14

| Ref. | Description | Sign | Example |
|---|---|---|---|
| $CGV_i$ | Voltage applied to the control gate $CGL_i$ of the transistors $TR_{i,j}$, $TE_{i,j}$ of the memory cell $C_{i,j}$ (read-selected memory cell) via the control gate line $CGL_i$ | positive | 2-3 V |
| $CGV_{i-1}$ | Voltage applied to the control gate $CGL_{i-1}$ of the transistors $TR_{i-1,j}$, $TE_{i-1,j}$ of the memory cell $C_{i-1,j}$ (twin memory cell not read-selected) via the control gate line $CGL_i$ | negative | −2 V |
| EBLV | Voltage applied to the bit line $EBL_j$ | — | 0 V |
| RBLV | Voltage applied to the bit line $RBL_j$ | positive | 1 V |
| SV | Select voltage applied to the word line $WL_{i-1,i}$ common to the twin memory cells $C_{i-1,j}$, $C_{i,j}$ | positive | 3 V |
| SPV | Source line voltage applied to all the source lines SL (or to the source plane) | — | 0 V |
| VB | Electric potential of the substrate PW | — | 0 V |
| CGV* | Voltage applied to all the other control gate lines CGL | — | 0 V |

TABLE 4-continued

Reading of $C_{i,j}$ via $TR_{i,j}$, FIG. 13 and 14

| Ref. | Description | Sign | Example |
|------|-------------|------|---------|
| EBLV* | Voltage applied to the non-selected bit lines EBL | — | 0 V |
| RBLV* | Voltage applied to the non-selected bit lines RBL | — | 0 V |
| SV* | Voltage applied to the non-selected word lines WL | — | 0 V |

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A non-volatile memory on a semiconductor substrate, comprising:
   bit lines,
   first memory cells of a first type each including a single floating-gate transistor, the floating-gate transistor of each of the first memory cells including a drain region electrically coupled to a first bit line of the bit lines,
   second memory cells of the first type each including a single floating-gate transistor, the floating-gate transistor of each of the second memory cells including a drain region electrically coupled to a second bit line of the bit lines, and
   memory cells of a second type each including:
      a first floating-gate transistor including a floating gate and a drain region electrically coupled to the first bit line, and
      a second floating-gate transistor including a floating gate and a drain region electrically coupled to the second bit line, wherein
   the floating gate of the first floating-gate transistor is electrically coupled to the floating gate of the second floating-gate transistor, and
   the second floating-gate transistor comprises a tunnel dielectric layer and a permanently conductive region extending on an opposite side of the tunnel dielectric layer with respect to the floating gate of the second floating-gate transistor.

2. The memory according to claim 1, comprising a first page-erasable or sector-erasable first sector, including memory cells of the first type, and a word-erasable or bit-erasable second sector that includes memory cells of the second type.

3. The memory according claim 1, wherein the conductive region of the second floating-gate transistor of each memory cell of the second type is a doped region of the substrate.

4. The memory according to claim 1, wherein:
   the first memory cell includes a select transistor configured to electrically couple the floating-gate transistor of the first memory cell of the first type to a source line;
   the second memory cell includes a select transistor configured to electrically couple the floating-gate transistor of the second memory cell of the first type to the source line; and
   each memory cell of the second type includes a select transistor configured to electrically couple the first floating-gate transistor of the memory cell of the second type to the source line.

5. The memory according to claim 4, wherein each select transistor comprises a vertical control gate embedded in the substrate.

6. The memory according to claim 4, wherein the memory cells of the first type and of the second type are arranged by pairs, and the select transistor of each memory cell of the second type each pair is shared with the memory cell of the first type of the pair.

7. The memory according to claim 1, comprising an erase circuit configured to erase a first selected memory cell of the memory cells of the second type by applying an erase voltage to the bit line to which the second floating-gate transistor of the first selected memory cell is coupled, so as to extract electric charges from the floating gate of the second floating-gate transistor of the first selected memory cell through the conductive region of the second floating-gate transistor of the first selected memory cell.

8. The memory according to claim 7, comprising a program circuit configured to:
   program a second selected memory cell of the memory cells of the first type by applying a programming voltage to the bit line to which the floating-gate transistor of the second selected memory cell is coupled, and
   program a third selected memory cell of the second type by applying a programming voltage to the bit line to which the second floating-gate transistor of the third selected memory cell is coupled.

9. The memory according to claim 7, comprising a read circuit configured to:
   read a second selected memory cell of the memory cells of the first type through the bit line to which the floating-gate transistor of the second selected memory cell is coupled, and
   read a third selected memory cell of the memory cells of the second type through the bit line to which the first floating-gate transistor of the third selected memory cell is coupled.

10. The memory according to claim 1, wherein the bit lines include a column of bit lines, the memory comprising:
   a read circuit associated with the column and configured to individually read memory cells coupled to the bit lines of the column,
   a programming circuit associated with the column and configured to program the memory cells coupled to the bit line of the column,
   an erase circuit associated with the column and configured to erase memory cells of the second type coupled to the bit lines of the column,
   a column decoder configured to:
      selectively couple the bit lines of the column of the memory to the read circuit and to the programming circuit, and couple to the erase circuit bit lines of the column that are coupled to the second floating-gate transistors of the memory cells of the second type.

11. The memory according to claim 10, wherein the column decoder is configured to:
couple any one of the bit lines to the read circuit to enable the read circuit to read one of the memory cells of the first type, and
couple to the read circuit the bit line coupled to the first floating-gate transistor of one of the memory cells of the second type.

12. The memory according to claim 10, wherein the column decoder is configured to:
couple any one of the bit lines to the programming circuit to enable the programming circuit to program one of the memory cells of the first type,
couple to the programming circuit the bit line coupled to the second floating-gate transistor of a selected memory cell of the memory cells of the second type, and
couple to the programming circuit the bit line coupled to the second floating-gate transistor of the selected memory cell of the second type.

13. The memory according to claim 10, wherein the program and erase circuits are grouped together in an erase or program block coupled to all the bit lines of the column through the column decoder, and configured to supply an erase voltage or a programming voltage.

14. The memory according to claim 10, wherein the column decoder is configured to receive an address of one of the bit lines within the column, a piece of information about a sector in which a memory cell is located, and a piece of information about a type of operation applied to a memory cell, the type of operation being a read, program or erase.

15. The memory according to claim 1, comprising a first page-erasable or sector-erasable first sector, including memory cells of the first type, and a word-erasable or bit-erasable second sector that includes memory cells of the second type, wherein the first sector comprises pages each including N binary words of memory cells, and the second sector comprises pages each including N/2 words of memory cells having an equal number of bits as the words of the first sector.

16. A memory cell, comprising:
a first floating-gate transistor including a floating gate, a source region, and a drain region, and
a second floating-gate transistor including a floating gate, a source region, and a drain region electrically, wherein
the floating gate of the first floating-gate transistor is electrically coupled to the floating gate of the second floating-gate transistor, and
the second floating-gate transistor comprises a tunnel dielectric layer and a permanently conductive region extending on an opposite side of the tunnel dielectric layer with respect to the floating gate of the second floating-gate transistor and electrically connecting the source and drain regions of the second floating-gate transistor to each other.

17. The memory cell according claim 16, wherein the conductive region of the second floating-gate transistor of each memory cell of the second type is a doped region of a semiconductor substrate.

18. The memory cell according to claim 16, comprising:
a select transistor configured to electrically couple the first floating-gate transistor of the memory cell of the second type to a source line.

19. The memory cell according to claim 18, wherein the select transistor comprises a vertical control gate embedded in a semiconductor substrate.

20. A non-volatile memory, comprising:
a first bit line;
a second bit line;
a first memory cell including a floating-gate transistor having a drain region electrically coupled to the first bit line;
a second memory cell including a floating-gate transistor having a drain region electrically coupled to the second bit line; and
a third memory cell including:
a first floating-gate transistor including:
a floating gate; and
a drain region electrically coupled to the first bit line; and
a second floating-gate transistor including:
a permanently conductive region;
a tunnel dielectric layer on the permanently conductive region;
a floating gate on the tunnel dielectric layer and electrically coupled to the floating gate of the first floating-gate transistor; and
a drain region electrically coupled to the second bit line.

21. The non-volatile memory according to claim 20, wherein the conductive region of the second floating-gate transistor is a doped region of a semiconductor substrate.

22. The non-volatile memory according to claim 20, wherein the third memory cell further includes a select transistor configured to electrically couple the first floating-gate transistor to a source line.

23. The non-volatile memory according to claim 22, wherein the select transistor includes a vertical control gate embedded in a semiconductor substrate.

* * * * *